(12) United States Patent
Cha et al.

(10) Patent No.: US 9,503,064 B2
(45) Date of Patent: Nov. 22, 2016

(54) SKEW CALIBRATION CIRCUIT AND OPERATION METHOD OF THE SKEW CALIBRATION CIRCUIT

(71) Applicant: Samsung Electronics Co., Ltd., Suwon-si, Gyeonggi-do (KR)

(72) Inventors: Gyeonghan Cha, Geoje-si (KR); Han-Kyul Lim, Seoul (KR); SungJun Kim, Suwon-si (KR); Chaeryung Kim, Seoul (KR); DongUk Park, Hwaseong-si (KR); Younwoong Chung, Seongnam-si (KR); JungMyung Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/792,985

(22) Filed: Jul. 7, 2015

(65) Prior Publication Data

US 2016/0036420 A1 Feb. 4, 2016

(30) Foreign Application Priority Data

Aug. 1, 2014 (KR) .......................... 10-2014-0099125

(51) Int. Cl.
| | | |
|---|---|---|
| *H03L 7/00* | (2006.01) | |
| *H03K 3/86* | (2006.01) | |
| *G06F 1/10* | (2006.01) | |
| *H03K 5/13* | (2014.01) | |
| *H03K 5/135* | (2006.01) | |
| *H03K 5/14* | (2014.01) | |

(52) U.S. Cl.
CPC ............ *H03K 3/86* (2013.01); *G06F 1/10* (2013.01); *H03K 5/131* (2013.01); *H03K 5/135* (2013.01); *H03K 5/14* (2013.01)

(58) Field of Classification Search
None
See application file for complete search history.

(56) References Cited

U.S. PATENT DOCUMENTS

| | | | |
|---|---|---|---|
| 6,820,234 B2 * | 11/2004 | Deas ................ | G01R 31/31725 713/503 |
| 6,937,681 B2 | 8/2005 | Watanabe | |
| 6,965,839 B2 | 11/2005 | Floyd et al. | |
| 7,031,420 B1 | 4/2006 | Jenkins et al. | |
| 7,120,838 B2 | 10/2006 | Casper et al. | |
| 7,205,803 B2 | 4/2007 | Chung et al. | |
| 7,209,531 B1 | 4/2007 | Katz et al. | |
| 7,844,021 B2 | 11/2010 | Gibbons et al. | |

(Continued)

*Primary Examiner* — Cassandra Cox
(74) *Attorney, Agent, or Firm* — Harness, Dickey & Pierce, P.L.C.

(57) ABSTRACT

A skew calibration circuit may include a data delay unit receiving first data and a first code, and output delayed first data as second data by delaying the first data according to the first code; a clock delay unit receiving a first clock signal and a second code, and output delayed first clock signal as second clock signal by delaying the first clock signal according to the second code; a multiplexer receiving a clock signal and output the clock signal or an inverted clock signal of the clock signal as a first clock signal in response to a selection signal; and a control logic unit receiving the second data and the second clock signal and control the first code, the second code and the selection signal in response to the second data and the second clock signal.

19 Claims, 19 Drawing Sheets

(56) References Cited

U.S. PATENT DOCUMENTS

| | | |
|---|---|---|
| 8,073,090 B2 | 12/2011 | Zhang et al. |
| 8,116,417 B2 | 2/2012 | Choi |
| 8,335,291 B2 | 12/2012 | Bae et al. |
| 8,581,654 B2 * | 11/2013 | Kim ...................... H04L 7/0337 327/291 |
| 8,766,690 B2 * | 7/2014 | Yen ........................ G09G 5/008 327/141 |
| 2004/0223566 A1 | 11/2004 | Yamashita |
| 2009/0274254 A1 | 11/2009 | Hirata |
| 2011/0244791 A1 | 10/2011 | Kang |
| 2012/0230158 A1 | 9/2012 | Chuang et al. |
| 2012/0294401 A1 | 11/2012 | Lin et al. |
| 2015/0207617 A1 * | 7/2015 | Usuda ...................... H03L 7/08 375/376 |

\* cited by examiner

US 9,503,064 B2

SKEW CALIBRATION CIRCUIT AND OPERATION METHOD OF THE SKEW CALIBRATION CIRCUIT

CROSS-REFERENCE TO RELATED APPLICATIONS

This U.S. non-provisional patent application claims priority under 35 U.S.C. §119 of Korean Patent Application No. 10-2014-0099125, filed on Aug. 1, 2014, the entire contents of which are hereby incorporated by reference.

BACKGROUND

Example embodiments of the inventive concepts relate to semiconductor circuits. For example, at least some of the example embodiments relate to a skew calibration circuit and an operation method of the skew calibration circuit.

To stably transmit data, the data may be transmitted together with a clock signal. A semiconductor device receiving the data and the clock signal may stably store the data value when a rising or falling edge of a clock signal occurs. As such, if the data is transmitted together with the clock signal, since the semiconductor receiving device stores the data value at time synchronized with the clock signal regardless of a data pattern, the data may be stably transmitted.

As data transmission rates increase, a frequency of the data and the clock signal may increase and, therefore, a period thereof may become shorter. When the frequency of the data and the clock signal increase, a skew present in the data and the clock signal may affect the stability of the data transmission. For example, conventionally, a skew may occur because a signal delay of a path through which the data is transmitted may be different from a signal delay of a path through which the clock signal is transmitted. Thus, methods and devices for calibrating a skew between the data and the clock signal are desired.

SUMMARY

Some example embodiments of the inventive concepts relate to a skew calibration circuit.

In some example embodiments, the skew calibration circuit may include a data delay unit configured to receive first data and a first code, and output delayed first data as second data by delaying the first data according to the first code; a clock delay unit configured to receive a first clock signal and a second code, and output delayed first clock signal as second clock signal by delaying the first clock signal according to the second code; a multiplexer configured to receive a clock signal and output the clock signal or an inverted clock signal of the clock signal as the first clock signal in response to a selection signal; and a control logic unit configured to receive the second data and the second clock signal and control the first code, the second code and the selection signal in response to the second data and the second clock signal.

In some example embodiments, the data delay unit is configured to control an amount of delay between the first data and the second data according to the first code.

In some example embodiments, a maximum amount of delay between the first data and the second data corresponds to a period in which one bit of the first or second data is transmitted.

In some example embodiments, the data delay unit is configured to control an amount of delay between the first clock signal and the second clock signal according to the second code.

In some example embodiments, a maximum amount of delay between the first clock signal and the second clock signal corresponds to a period in which one bit of the first or second data is transmitted.

In some example embodiments, the second data comprises a pattern of predetermined bits, and the control unit controls the first code and the second code so that a first bit of the second data is aligned with a rising or falling edge of the clock signal.

In some example embodiments, the control unit controls an amount of delay between the first data and the second data by controlling the first code and determines whether the first bit is aligned with the rising or falling edge.

In some example embodiments, if the first bit is aligned with the rising or falling edge, the control unit controls the first code to maintain the amount of delay of when the first bit is aligned with the rising or falling edge.

In some example embodiments, if the first bit is not aligned with the rising or falling edge, the control unit controls an amount of delay between the first clock signal and the second clock signal by controlling the second code and determines whether the first bit is aligned with the rising or falling edge.

In some example embodiments, the control unit determines whether the first bit is aligned with the rising or falling edge on the basis of a determination result of when controlling the amount of delay between the first data and the second data and a determination result of when controlling the amount of delay between the first clock signal and the second clock signal.

In some example embodiments, if a value of the first data is not the first bit when the rising edge or the falling edge occurs, the control unit controls the selection signal so that an inverted signal of the clock signal is output as the first clock signal.

Other example embodiments of the inventive concepts also relate to an operation method of a skew calibration circuit calibrating a skew between data and a clock signal.

In some example embodiments, the operation method may include receiving the clock signal and the data; performing a first detection detecting whether the clock signal is aligned with the data while delaying the data; and performing a second detection, if the clock signal is not aligned with the data in the first detection, detecting whether the clock signal is aligned with the data while delaying the clock signal, wherein if the clock signal is aligned with the data in the first detection, an alignment between the clock signal and the data is maintained and the second detection is omitted, and wherein if the clock signal is aligned with the data in the second detection, an alignment between the clock signal and the data is maintained.

In some example embodiments, if the clock signal is not aligned with the data in the second detection, the clock signal is inverted and the first detection is performed again using the inverted clock signal.

In some example embodiments, if sync of the data and the clock signal is passed, the performing the first detection comprises detecting a first point at which sync of the delayed data and the clock signal is converted from a pass into a fail while sequentially delaying an amount of delay of the data. If sync of the data and the clock signal is passed, the performing the second detection comprises detecting a second point at which sync of the delayed data and the clock signal is converted from a pass into a fail while sequentially delaying an amount of delay of the clock signal. If a median point of the first point and the second point corresponds to a range in which the data is delayed to be aligned, the data is delayed to the median point and if the median point corresponds to a range in which the clock signal is delayed, the clock signal is delayed to the median point to be aligned.

In some example embodiments, if sync of the data and the clock signal is failed, the performing the first detection comprises: detecting a first point at which sync of the delayed data and the clock signal is converted from a fail into a pass while sequentially delaying the amount of delay of the data; detecting, if the first point is detected, a second point at which sync of the delayed data and the clock signal is converted from a pass into a fail after the first point while sequentially more delaying the amount of delay of the data; and aligning, if the second point is detected, the data and the clock signal using the a median point of the first point and the second point. If the second point is not detected, the clock signal is inverted and the first detection and the second detection are performed again using the inverted clock signal.

In some example embodiments, the skew calibration circuit may include first buffers configured to delay a received data signal to generate an output data signal; second buffers configured to generate an output clock signal by delaying one of a received clock signal and an inverted version of the received clock signal based on a selection signal; a switching device configured to enable a number of the first buffers and a number of the second buffers based on a first code and a second code, respectively; and a controller configured to generate the first code, the second code, and the selection signal based on the output data signal and the output clock signal.

BRIEF DESCRIPTION OF THE FIGURES

Some example embodiments of the inventive concepts will be described below in more detail with reference to the accompanying drawings. The example embodiments of the inventive concepts may, however, be embodied in different forms and should not be constructed as limited to the example embodiments set forth herein. Rather, these example embodiments are provided so that this disclosure will be thorough and complete, and will fully convey the scope of the example embodiments of inventive concepts to those skilled in the art. Like numbers refer to like elements throughout.

DETAILED DESCRIPTION

Figure 1:
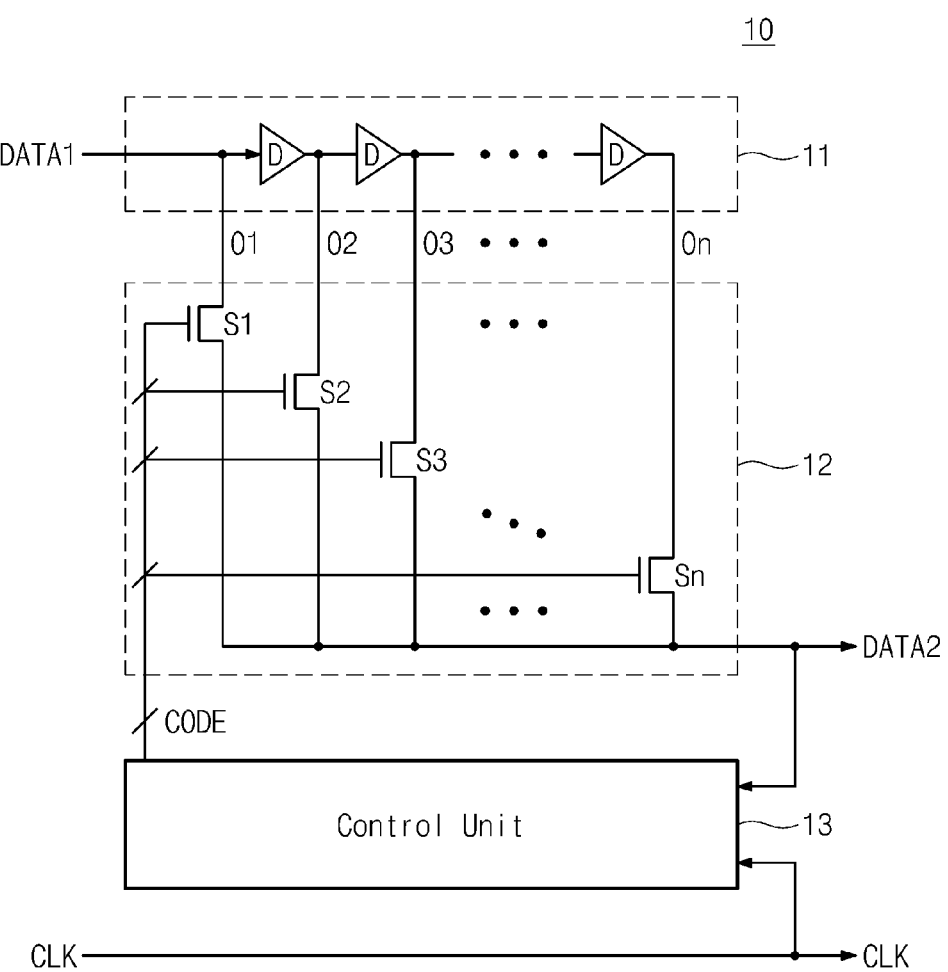
FIG. 1 is a skew calibration circuit in accordance with some example embodiments of the inventive concepts.

Example embodiments of inventive concepts will be described more fully hereinafter with reference to the accompanying drawings, in which some example embodiments are shown. These inventive concepts may, however, be embodied in many different forms and should not be construed as limited to the example embodiments set forth herein. Rather, these example embodiments are provided so that this disclosure will be thorough and complete, and will fully convey the scope of the example embodiments of the inventive concepts to those skilled in the art. In the drawings, the size and relative sizes of layers and regions may be exaggerated for clarity. Like numbers refer to like elements throughout.

Example embodiments will now be described more fully with reference to the accompanying drawings, in which some example embodiments are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for purposes of describing example embodiments. Example embodiments may be embodied in many alternate forms and should not be construed as limited to only those set forth herein.

It should be understood, however, that there is no intent to limit this disclosure to the particular example embodiments disclosed. On the contrary, example embodiments are to cover all modifications, equivalents, and alternatives falling within the scope of the example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Various example embodiments will now be described more fully with reference to the accompanying drawings in which some example embodiments are shown. In the drawings, the thicknesses of layers and regions are exaggerated for clarity.

FIG. 1 is a skew calibration circuit in accordance with some example embodiments of the inventive concepts.

Referring to FIG. 1, a skew calibration circuit 10 includes a delay unit 11, a selection unit 12 and a control unit 13. In some example embodiments, the delay unit 11 may be referred to as a delay circuit and the control unit 13 may be referred to as a controller.

The delay unit 11 receives first data DATA1 from the outside. The delay unit 11 can delay the received first data DATA1 by different amounts of delay to output first through nth output signals O1~On.

The delay unit 11 includes a plurality of delayers D that are serially connected to one another to delay the first data DATA1. Each delayer D may be configured to delay an input signal to output the delayed input signal. The amount of delay of each delayer D may be smaller than 1 UI (unit instance). The 1 UI may be a period (for example, a period of time) in which one bit of the first data DATA1 is transmitted. An input of the first delayer D is output as a first output signal O1 without adding any delay thereto. That is, the first data DATA1 not delayed may be output as the first output signal O1. Outputs of the remaining delayers D may be output as second through nth output signals O2~On respectively. However, example embodiments are not limited thereto.

The selection unit 12 can receive the first through nth output signals O1~On from the delay unit 11 and receive a code CODE from the control unit 13. The selection unit 12 can select one of the first through nth output signals O1~On in response to the code CODE. The selected output signal is output as second data DATA2.

The control unit 13 receives the second data DATA2 and a clock signal CLK. In response to the second data DATA2 and the clock signal CLK, the control unit 13 can control the code CODE. The control unit 13 can control the code CODE such that the selection unit 12 selects an output signal aligned with the clock signal CLK among the output signals O1~On as the second data DATA2. That is, the control unit 13 is configured to control the amount of delay of the data so that the data is aligned with the clock signal CLK.

The alignment may mean a state that a skew between the second data DATA2 and the clock signal CLK is compensated, reduced and/or removed, or an operation of compensating, reducing and/or removing a skew. If a specific edge of the clock signal CLK is located at the center of a period of one bit of the second data DATA2, a skew between the second data DATA2 and the clock signal CLK may not exist. That is, if a specific edge of the clock signal CLK is located at the center of a period of one bit of the second data DATA2, the second data DATA2 may be aligned with the clock signal CLK.

Figure 2:
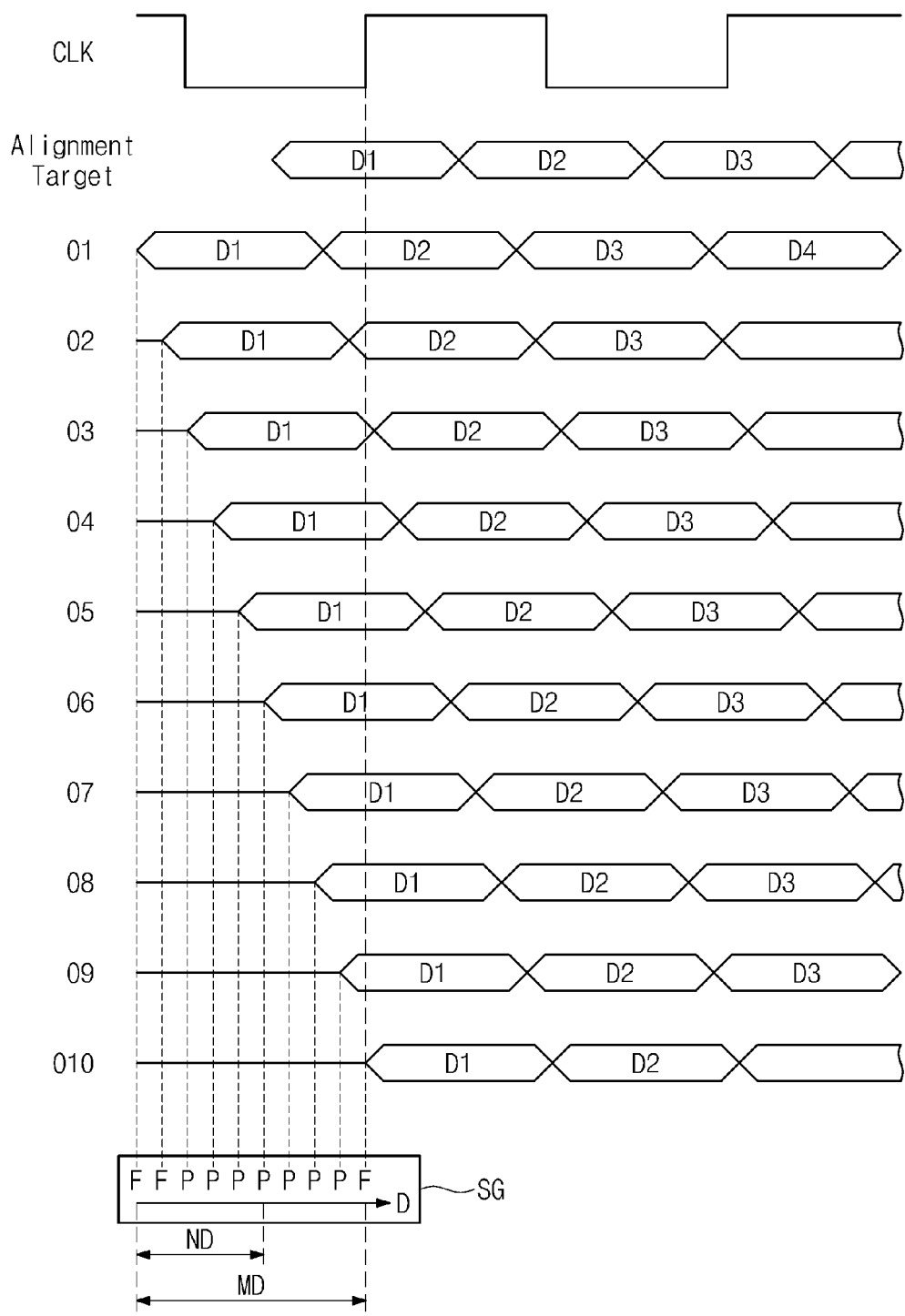
FIG. 2 illustrates a method in which a skew calibration circuit selects one output signal among a plurality of output signals as second data.

FIG. 2 illustrates a method in which a skew calibration circuit selects one output signal among a plurality of output signals as second data.

Referring to FIGS. 1 and 2, when a skew calibration is performed in the skew calibration circuit 10, the first data DATA1 being received to the skew calibration circuit 10 may have a set (or, alternatively, a predetermined) pattern. For example, the first data DATA1 being received to the skew calibration circuit 10 may have first through fourth bits D1~D4.

A first bit D1 of the first data DATA1 may be set (or, alternatively, predetermined) to be synchronized with a rising edge of the clock signal CLK. A second bit D2 of the second data DATA2 may be set (or, alternatively, predetermined) to be synchronized with a falling edge of the clock signal CLK. A third bit D3 of the second data DATA2 may be set (or, alternatively, predetermined) to be synchronized with a rising edge of the clock signal CLK. A fourth bit D4 of the second data DATA2 may be set (or, alternatively, predetermined) to be synchronized with a falling edge of the clock signal CLK.

If a rising edge of the clock signal CLK is located at the center of a period of the first bit D1 or the third bit D3 of the second data DATA2, a skew between the second data DATA2 and the clock signal CLK may not exist. That is, the second data DATA2 is aligned with the clock signal CLK.

If the rising edge of the clock signal CLK is not located at the first bit D1 or the third bit D3 of the second data DATA2, the skew calibration circuit 10 may align the second data DATA2 with the clock signal CLK by determining the amount of delay of the delay unit 11 in which a rising edge of the clock signal CLK is located at the center of a period of the first bit D1 of the second data DATA2 and delaying the first data DATA1 according to the determined amount of delay to generate the second data DATA2. For example, the skew calibration circuit 10 may determine which of the first through nth output signals O1~On output as the second data DATA2 has a center thereof aligned with the rising edge of the clock signal CLK.

In FIG. 2, the clock signal CLK and an alignment target aligned with the clock signal CLK are illustrated.

The control unit 13 can control the delay unit 11 and the selection unit 12 so that the first through nth output signals O1~On are sequentially selected. The control unit 13 can compare an output signal being output to the second data DATA2 with the clock signal CLK and perform an alignment according to the comparison result.

The first output signal O1 may correspond to the first data DATA1 without a delay added thereto. As illustrated in FIG. 2, at a rising edge of the clock signal CLK, a value of the first output signal O1 is not the first bit D1. In this case, the control unit 13 may judge that the clock signal CLK and the first output signal O1 are not synchronized.

After sync of the first output signal O1 is judged, sync of the second output signal O2 is judged. At a rising edge of the clock signal CLK, a value of the second output signal O2 is not the first bit D1. The control unit 13 judges that the clock signal CLK and the second output signal O2 are not synchronized.

At a rising edge of the clock signal CLK, a value of the third output signal O3 is the first bit D1. The control unit 13 judges that the clock signal CLK and the third output signal O3 are sufficiently synchronized.

At a rising edge of the clock signal CLK, values of the fourth through ninth output signals O4~O9 are the first bit D1. The control unit 13 judges that sync of the fourth through ninth output signals O4~O9 are sufficiently synchronized.

At a rising edge of the clock signal CLK, a value of the tenth output signal O10 is not the first bit D1. The control unit 13 judges that sync of the clock signal CLK and the tenth output signal O10 are not synchronized.

Whether syncs of the output signals O1~O10 are sufficiently synchronized with the clock signal CLK is illustrated in sync graph SG below FIG. 2. In the sync graph SG, a delay axis D indicates the amount of delay of the first data DATA1. That is, the sync graph SG indicates whether sync of the second data DATA2 is passed or failed according to the amount of delay of the first data DATA1.

The control unit 13 can perform a determination of syncs of the output signals O1~O10 until syncs of the output signals O1~O10 are changed from a fail F to a pass P and then is changed from a pass P to a fail F again. Output signals that are located between output signals having syncs determined to be failed and have syncs determined to be passed can form a pass group. In FIG. 2, the third through ninth output signals O3~O9 may be included in the pass group.

The control unit 13 can confirm an output signal having a median amount of delay (or an average amount of delay) among the output signals included in the pass group as the second data DATA2. For example, the control unit 13 can confirm the sixth output signal O6 having the median amount of delay (or the average amount of delay) among the third through ninth output signals O3~O9 as the second data DATA2. The control unit 13 can control the delay unit 11 and the selection unit 12 so that the sixth output signal O6 is maintained to be the second data DATA2.

As illustrated in FIG. 2, the sixth output signal O6 has the same timing as the alignment target. That is, the second data DATA2 is aligned with the clock signal CLK.

When the second data DATA2 is aligned with the clock signal CLK, the control unit 13 determines a pass group. When determining the pass group, the amount of delay of the first data DATA1 used for determining the pass group is a maximum amount of delay MD.

The maximum amount of delay MD may affect a size of the skew calibration circuit 10, power consumption and a calibration speed.

For example, as the maximum amount of delay MD increases, the number of delayers D in the delay unit 11 may increase. Thus, as the number of delayers D needed in the delay unit 11 increases, a size of the skew calibration circuit 10 may increase. As the maximum amount of delay MD increases, the number of delayers being activated when being aligned among the delayers D of the delay unit 11 may increase. Further, as the number of delayers being activated when being aligned increases, power consumption of the skew calibration circuit 10 may increase. Further still, as the maximum amount of delay MD increases, the number of times that sync of an output signal is determined may increase. As the number of times that sync of an output signal is determined increases, a calibration speed of the skew calibration circuit 10 may be degraded.

After the second data DATA2 is aligned with the clock signal CLK, the control unit 13 controls the delay unit 11 and the selection unit 12 so that the aligned second data DATA2 is maintained. The amount of delay when the aligned second data DATA2, that is, the sixth output signal O6 is maintained is the normal amount of delay ND.

The normal amount of delay ND affects power consumption of the skew calibration circuit 10. For example, as the normal amount of delay ND increases, the number of delayers being maintained in an activation state after being aligned among the delayers D of the delay unit 11 may increase. As the number of delayers being maintained in an activation state after being aligned increases, power consumption of the skew calibration circuit 10 may increase.

In FIG. 2, the first bit D1 or the third bit D3 of the first data DATA1 is aligned with a rising edge of the clock signal CLK. However, example embodiments of the inventive concepts are not limited thereto. For example, the second bit D2 or the fourth bit D4 of the first data DATA1 may be aligned with a falling edge of the clock signal CLK.

Figure 3:
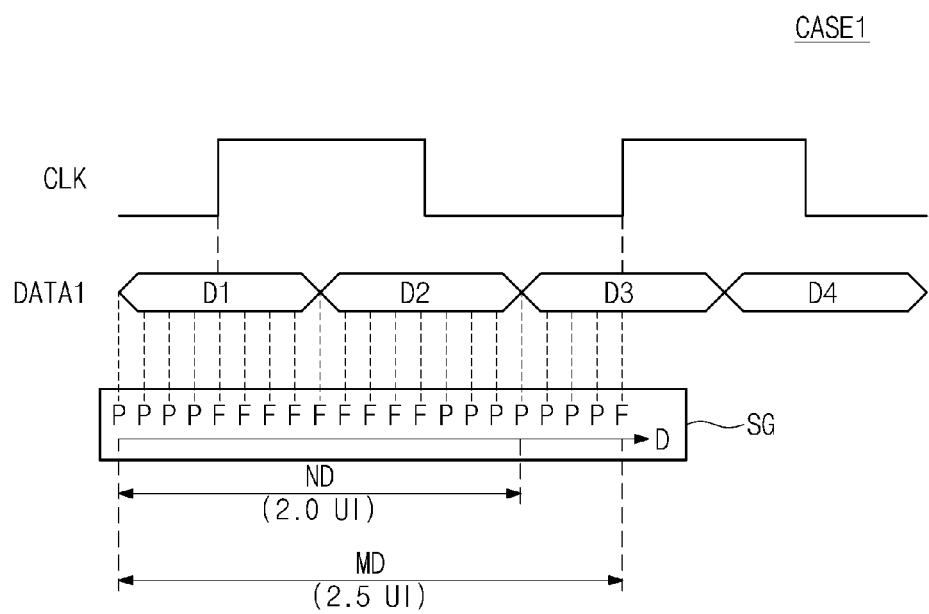
FIG. 3 illustrates a first case in which a skew calibration circuit aligns first data with a clock signal.

FIG. 3 illustrates a first case in which a skew calibration circuit aligns first data and a clock signal.

Referring to FIGS. 1 and 3, in a first scenario CASE1, the first data DATA1 may be received in a state aligned with the clock signal CLK.

The control unit 13 can detect a pass group while sequentially delaying the first data DATA1. An operation in which the control unit 13 detects the pass group may be performed according to the method described with reference to FIG. 2. For a brief description, in FIG. 3, an operation of detecting the pass group while delaying the first data DATA1 is illustrated using the sync graph SG.

Referring to the sync graph SG, the maximum amount of delay when the pass group is detected may be 2.5 UI. The normal amount of delay ND when an alignment is completed may be 2.0 UI.

Figure 4:
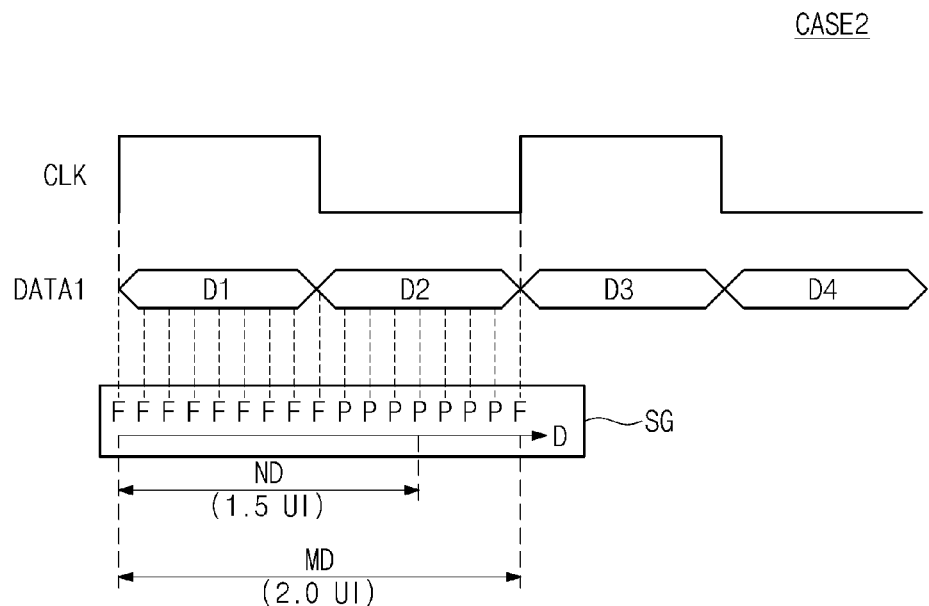
FIG. 4 illustrates a second case in which a skew calibration circuit aligns first data with a clock signal.

FIG. 4 illustrates a second case in which a skew calibration circuit aligns first data and a clock signal.

Referring to FIGS. 1 and 4, in a second scenario CASE2, the first data DATA1 may be delayed by 0.5 UI as compared with the clock signal CLK.

The control unit 13 can detect the pass group while sequentially delaying the first data DATA1. An operation in which the control unit 13 detects the pass group may be performed according to the method described with reference to FIG. 2. For a brief description, in FIG. 4, an operation of detecting the pass group while delaying the first data DATA1 is illustrated using the sync graph SG.

Referring to the sync graph SG, the maximum amount of delay when the pass group is detected may be 2.0 UI. The normal amount of delay ND when an alignment is completed may be 1.5 UI.

Figure 5:
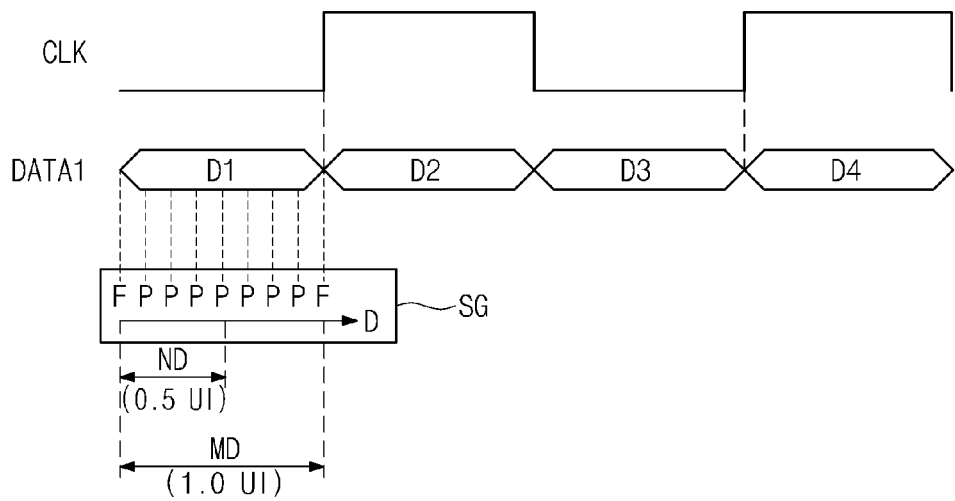
FIG. 5 illustrates a third case in which a skew calibration circuit aligns first data with a clock signal.

FIG. 5 illustrates a third case in which a skew calibration circuit aligns first data and a clock signal.

Referring to FIGS. 1 and 5, in a third scenario CASE3, the first data DATA1 may be delayed by 1.5 UI as compared with the clock signal CLK.

The control unit 13 can detect the pass group while sequentially delaying the first data DATA1. An operation in which the control unit 13 detects the pass group may be performed according to the method described with reference to FIG. 2. For a brief description, in FIG. 5, an operation of detecting the pass group while delaying the first data DATA1 is illustrated using the sync graph SG.

Referring to the sync graph SG, the maximum amount of delay when the pass group is detected may be 1.0 UI. The normal amount of delay ND when an alignment is completed may be 0.5 UI.

Figure 6:
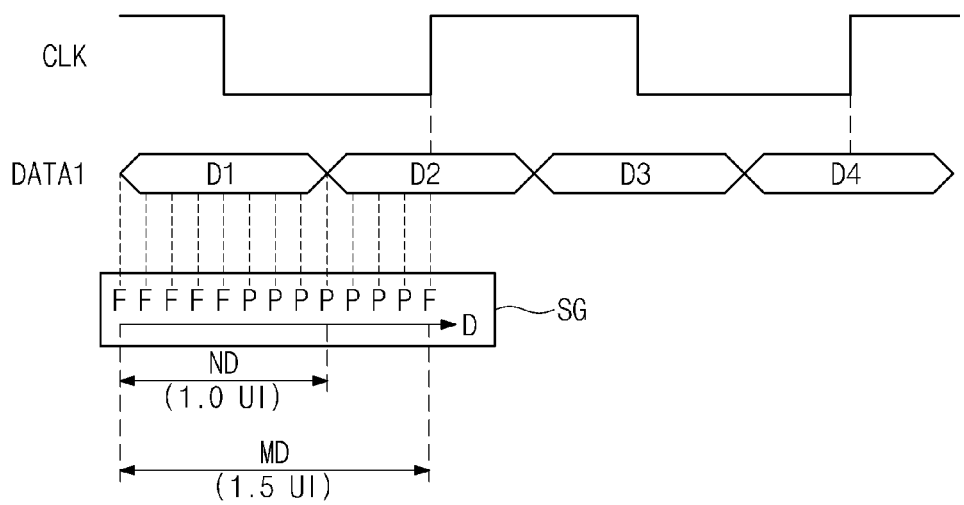
FIG. 6 illustrates a fourth case in which a skew calibration circuit aligns first data with a clock signal.

FIG. 6 illustrates a fourth case in which a skew calibration circuit aligns first data and a clock signal.

Referring to FIGS. 1 and 6, in a fourth scenario CASE4, the first data DATA1 may be delayed by 1.0 UI as compared with the clock signal CLK.

The control unit 13 can detect the pass group while sequentially delaying the first data DATA1. An operation in which the control unit 13 detects the pass group may be performed according to the method described with reference to FIG. 2. For a brief description, in FIG. 6, an operation of detecting the pass group while delaying the first data DATA1 is illustrated using the sync graph SG.

Referring to the sync graph SG, the maximum amount of delay when the pass group is detected may be 1.5 UI. The normal amount of delay ND when an alignment is completed may be 1.0 UI.

Figure 7:
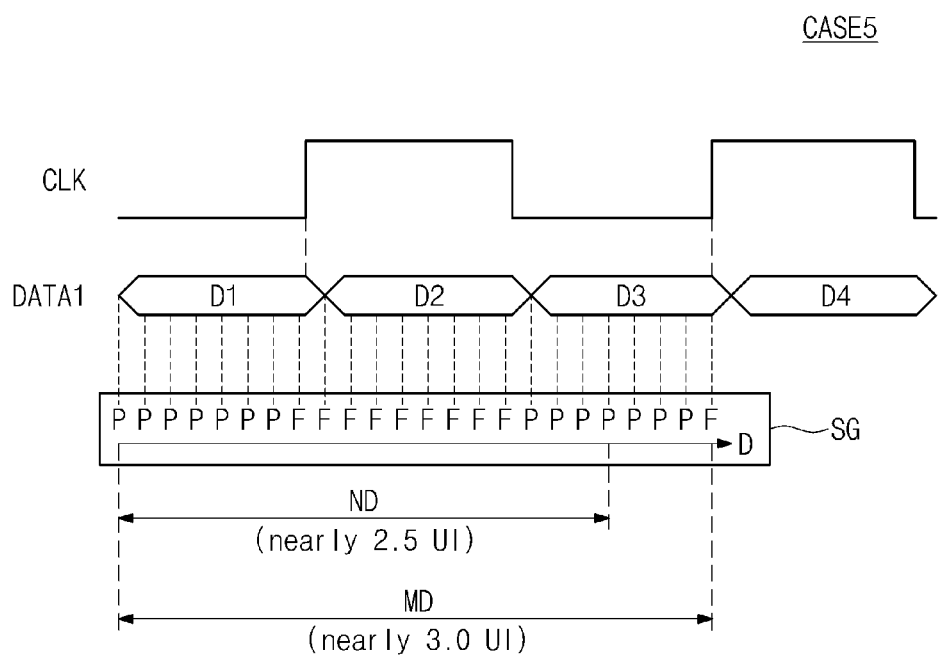
FIG. 7 illustrates a fifth case in which a skew calibration circuit aligns first data with a clock signal.

FIG. 7 illustrates a fifth case in which a skew calibration circuit aligns first data and a clock signal.

Referring to FIGS. 1 and 7, in a fifth scenario CASE5, the first data DATA1 may be delayed by 1.5 UI as compared with the clock signal CLK.

The control unit 13 can detect the pass group while sequentially delaying the first data DATA1. An operation in which the control unit 13 detects the pass group may be performed according to the method described with reference to FIG. 2. For a brief description, in FIG. 7, an operation of detecting the pass group while delaying the first data DATA1 is illustrated using the sync graph SG.

Referring to the sync graph SG, the maximum amount of delay when the pass group is detected may be a value close to 3.0 UI. The normal amount of delay ND when an alignment is completed may be a value close to 2.5 UI.

Figure 8:
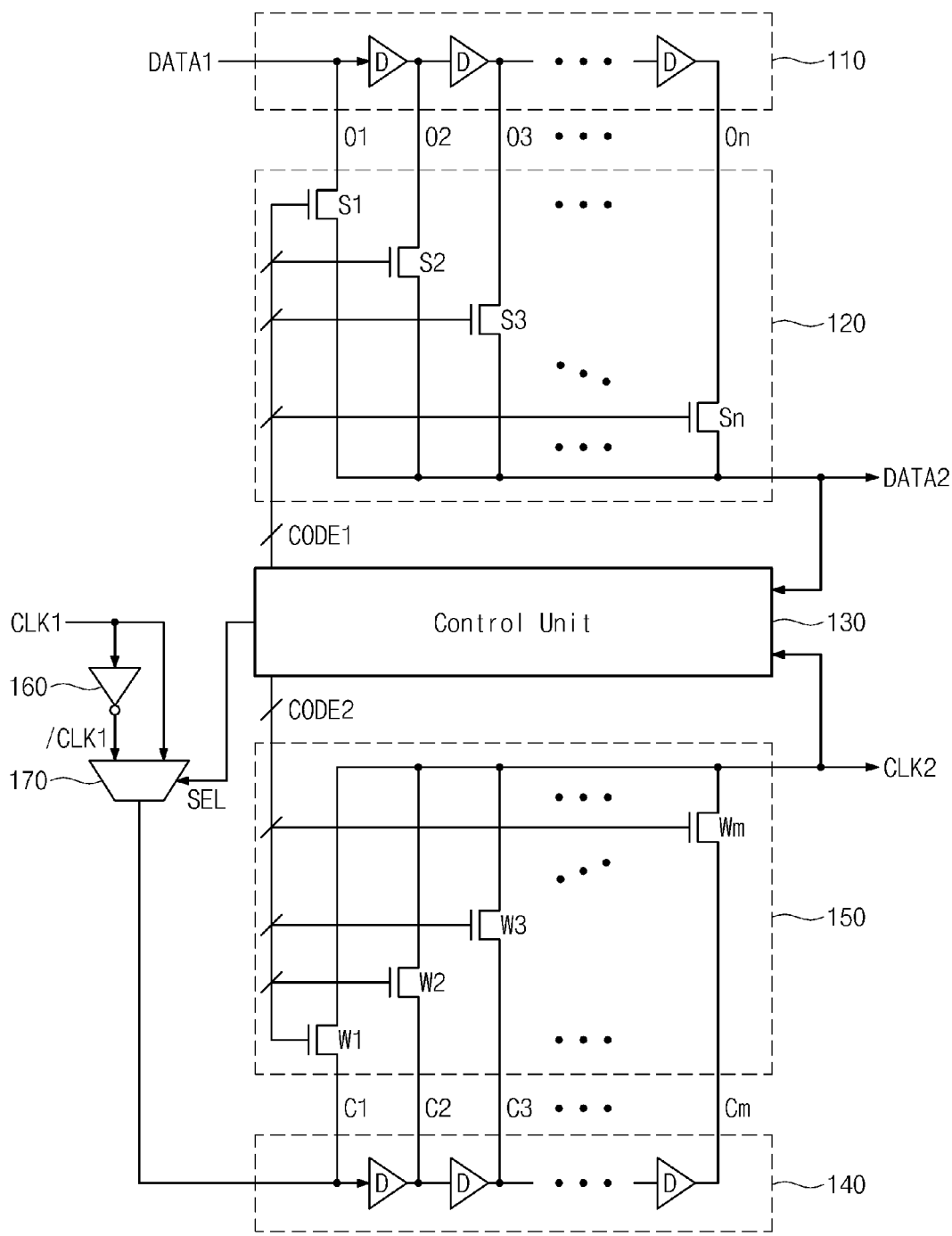
FIG. 8 illustrates a skew calibration circuit in accordance with some example embodiments of the inventive concepts.

FIG. 8 illustrates a skew calibration circuit in accordance with some example embodiments of the inventive concepts.

Referring to FIG. 8, a skew calibration circuit 100 includes a first delay unit 110, a first selection unit 120, a control unit 130, a second delay unit 140, a second selection unit 150, an inverter 160 and a multiplexer 170. As discussed in more detail below, the first delay unit 110 and the first selection unit 120 may constitute a data delay unit configured to selectively delay first data DATA1 input thereto, while the second delay unit 140 and the second selection unit 150 may constitute a clock delay unit configured to delay a first clock signal CLK1 input thereto.

The skew calibration circuit 100 can receive first data DATA1 and a first clock signal CLK1 from an external device. The skew calibration circuit 100 can output second data DATA2 and a second clock signal CLK2 based on the first data DATA1 and the first clock signal CLK1. The second data DATA2 may have the same timing as the first data DATA1 or may have timing that is delayed as compared to the first data DATA1. Likewise, the second clock signal CLK2 may have the same timing as the first clock signal CLK1 or may have timing that is delayed as compared to the first clock signal CLK1.

The skew calibration circuit 100 can align the second data DATA2 and the second clock signal CLK2 by delaying at least one among the data and the clock signal. The skew calibration circuit 100 can output the aligned second data DATA2 and the second clock signal CLK2 to an external device.

The first delay unit 110 and the first selection unit 120 may form a data delay unit delaying the first data DATA1 to output the second data DATA2. The first delay unit 110 includes a plurality of delayers D serially connected to one another. The first data DATA1 and output signals of the delayers D are output to first through nth output signals O1~On respectively.

The first selection unit 120 receives the first through nth output signals O1~On. In response to a first code CODE1, the first selection unit 120 can output one output signal among the first through nth output signals O1~On as the second data DATA2. The first selection unit 120 may include a plurality of switches S1~Sn that operates in response to bits of the first code CODE1 respectively. The second data DATA2 may be output to an external device and the second data DATA2 may also be provided to the control unit 130.

The second delay unit 140 and the second selection unit 150 may form a clock delay unit delaying the first clock signal CLK1 to output the second clock signal CLK2. The second delay unit 140 includes a plurality of delayers D serially connected to one another. The first clock signal CLK1 and output signals of the delayers D are output to first through mth output clocks C1~Cm respectively.

The second selection unit 150 receives the first through mth output clocks C1~Cm. In response to a second code CODE2, the second selection unit 150 can output one output clock among the first through mth output clocks C1~Cm as the second clock signal CLK2. The second selection unit 150 includes a plurality of switches W1~Wm that operates in response to bits of the second code CODE2 respectively. The second clock signal CLK2 is output to an external device and is provided to the control unit 130.

The inverter 160 can invert the first clock signal CLK1 to output an inverted clock signal /CLK1.

The multiplexer 170 can provide one of the first clock signal CLK1 and the inverted clock signal /CLK1 to the second delayer 140 in response to a selection signal SEL.

The control unit 130 is configured to generate the first code CODE1, the second code CODE2 and the selection signal SEL in response to the second data DATA2 and the second clock signal CLK2.

The control unit 130 can align the second data DATA2 and the second clock signal CLK2 using the first code CODE1, the second code CODE2 and the selection signal SEL.

The control unit 130 may delay the first data DATA1 using the first delay unit 110 and the first selection unit 120 and can perform a first detection operation to detect whether the second data DATA2 and the second clock signal CLK2 are aligned. Further, the control unit 130 may delay the first clock signal CLK1 using the second delay unit 140 and the second selection unit 150 and can perform a second detection operation to detect whether the second data DATA2 and the second clock signal CLK2 are aligned.

The control unit 130 converts the first clock signal CLK1 using the selection signal SEL and can perform the first and second detection operations using the inverted clock signal /CLK1.

The control unit 130 may include a processor and a memory (not shown).

The memory may be any device capable of storing data including magnetic storage, flash storage, etc. The processor may be any device capable of processing data including, for example, a microprocessor configured to carry out specific operations by performing arithmetical, logical, and input/output operations based on input data, or capable of executing instructions included in computer readable code stored in the memory. The processor may be a logic chip, for example, a central processing unit (CPU), a controller, or an application-specific integrated circuit (ASIC), that when, executing the instructions stored in the memory, configures the processor as a special purpose machine to perform the operations illustrated in one or more of FIGS. 9 and 18, discussed below. For example, the instructions may configure the processor to generate the first code CODE1, the second code CODE 2 and the selection signal SEL in response to the second data DATA2 and the second clock signal CLK2 such that each of the first delay unit and the second delay unit 140 enable delayers D equal to a delay of no more than 1.0 UI. Therefore, the skew calibration circuit 100 may improve the functioning of a computing device itself by increasing the calibration speed of the skew calibration circuit 100 while reducing power consumption.

The maximum amount of delay of delayers D of the first delay unit 110 may be limited to under 1.0 UI of the first data DATA1 or the second data DATA2. The maximum amount of delay of delayers D of the second delay unit 140 may be limited to under 1.0 UI of the first data DATA1 or the second data DATA2.

Figure 9:
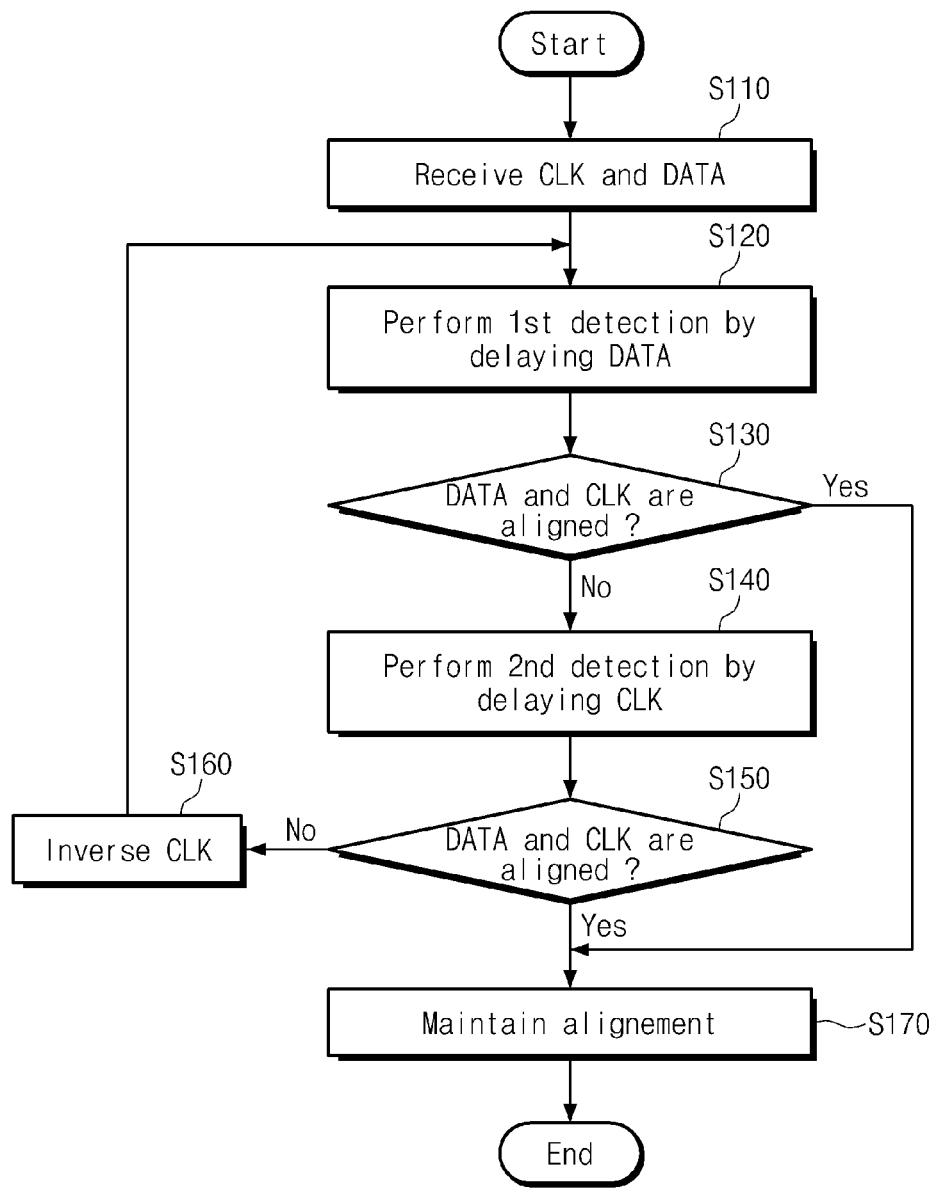
FIG. 9 is a flowchart illustrating a first example of an operation method of a skew calibration circuit in accordance with some example embodiments of the inventive concepts.

FIG. 9 is a flowchart illustrating a first example of an operation method of a skew calibration circuit in accordance with some example embodiments of the inventive concepts.

Referring to FIGS. 8 and 9, in operation S110, the skew calibration circuit 100 receives the first clock signal CLK1 and the first data DATA1.

In operation S120, the skew calibration circuit 100 performs the first detection operation by delaying the first data DATA1 without delaying the first clock signal CLK1. For example, the skew calibration circuit 100 generates the second clock signal CLK2 without delaying the first clock signal CLK1, generates the second data DATA2 by gradually delaying the first data DATA1 and detects whether the second data DATA2 and the second clock signal CLK2 are aligned.

In operation S130, if the second data DATA2 and the second clock signal CLK2 are aligned, the skew calibration circuit 100 performs operation S170. If the second data DATA2 and the second clock signal CLK2 are not aligned, the skew calibration circuit 100 performs operation S140.

In operation S140, the skew calibration circuit 100 performs the second detection operation by delaying the first clock signal CLK1 without delaying the first data DATA1. For example, the skew calibration circuit 100 generates the second data DATA2 without delaying the first data DATA1, generates the second clock signal CLK2 by gradually delaying the first clock signal CLK1 and detects whether the second data DATA2 and the second clock signal CLK2 are aligned.

In operation S150, the skew calibration circuit 100 detects whether the second data DATA2 and the second clock signal CLK2 are aligned using a comparison result of the second data DATA2 and the second clock signal CLK2 of the first detection operation and a comparison result of the second data DATA2 and the second clock signal CLK2 of the second detection operation.

In operation S150, if the skew calibration circuit 100 determines that the second data DATA2 and the second clock signal CLK2 are aligned, the skew calibration circuit 100 may perform operation S170. In operation S150, if the skew calibration circuit 100 determines that the second data DATA2 and the second clock signal CLK2 are not aligned, the skew calibration circuit 100 may perform operation S160.

In operation S160, if the second data DATA2 and the second clock signal CLK2 are not aligned, the skew calibration circuit 100 may convert the first clock signal CLK1. For example, the skew calibration circuit 100 can control the selection signal SEL so that the multiplexer 170 outputs the inverted clock signal /CLK1, and thereafter, the skew calibration circuit 100 may perform operation S120 again.

In operation S170, if the second data DATA2 and the second clock signal CLK2 are aligned, the skew calibration circuit 100 maintains the alignment.

Figure 10:
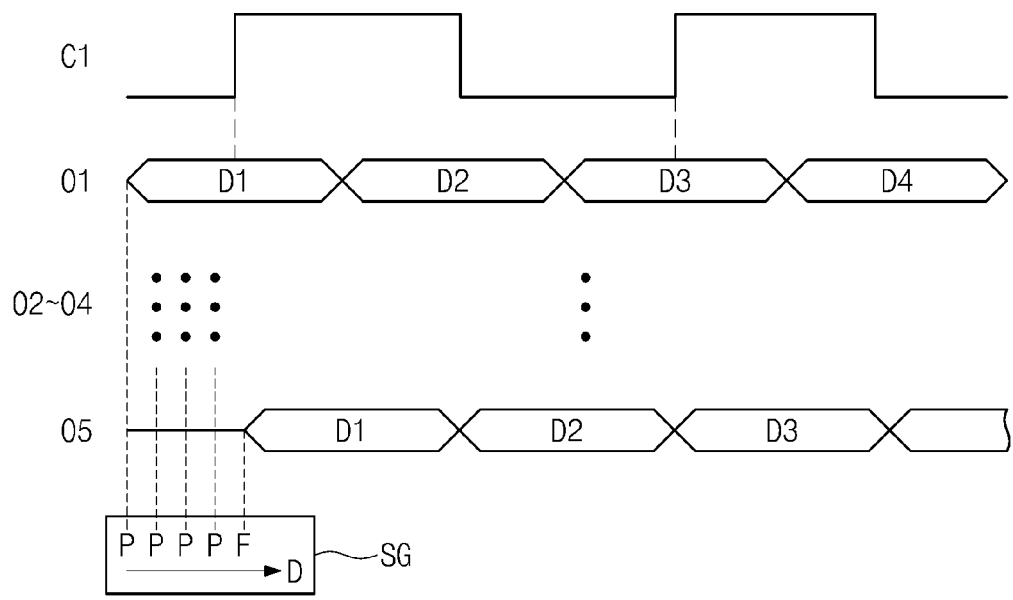
FIGS. 10 through 12 illustrate a first case in which a skew calibration circuit in accordance with some example embodiments of the inventive concepts aligns first data with a first clock signal.
Figure 11:
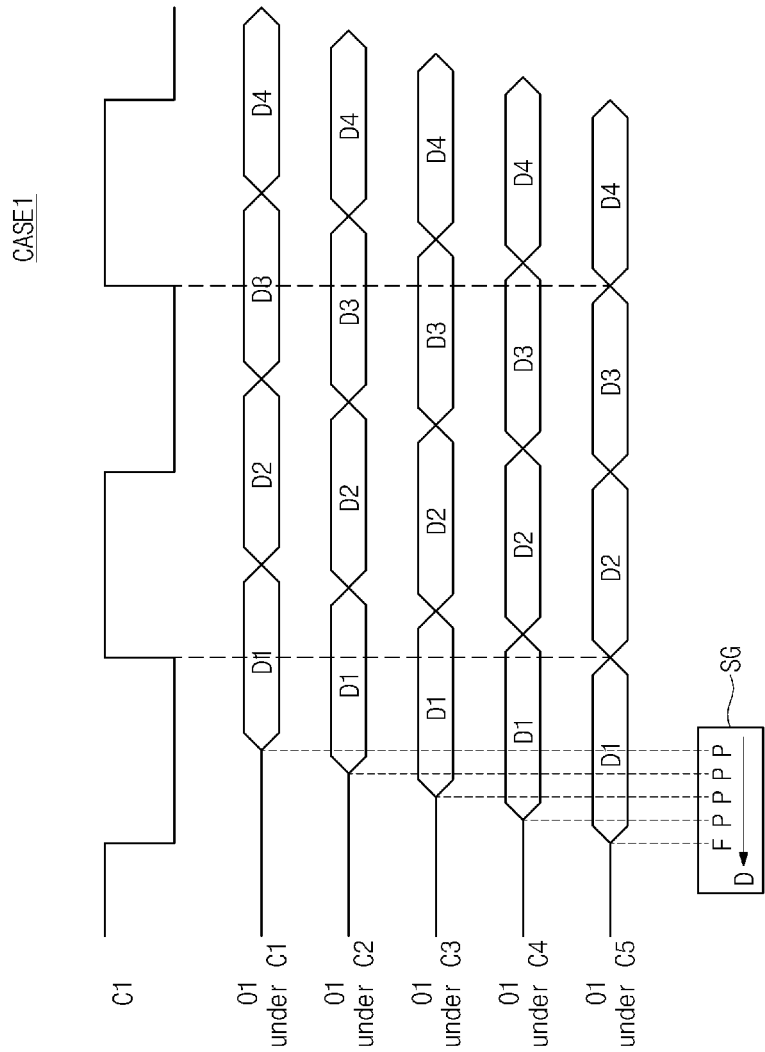
Figure 12:
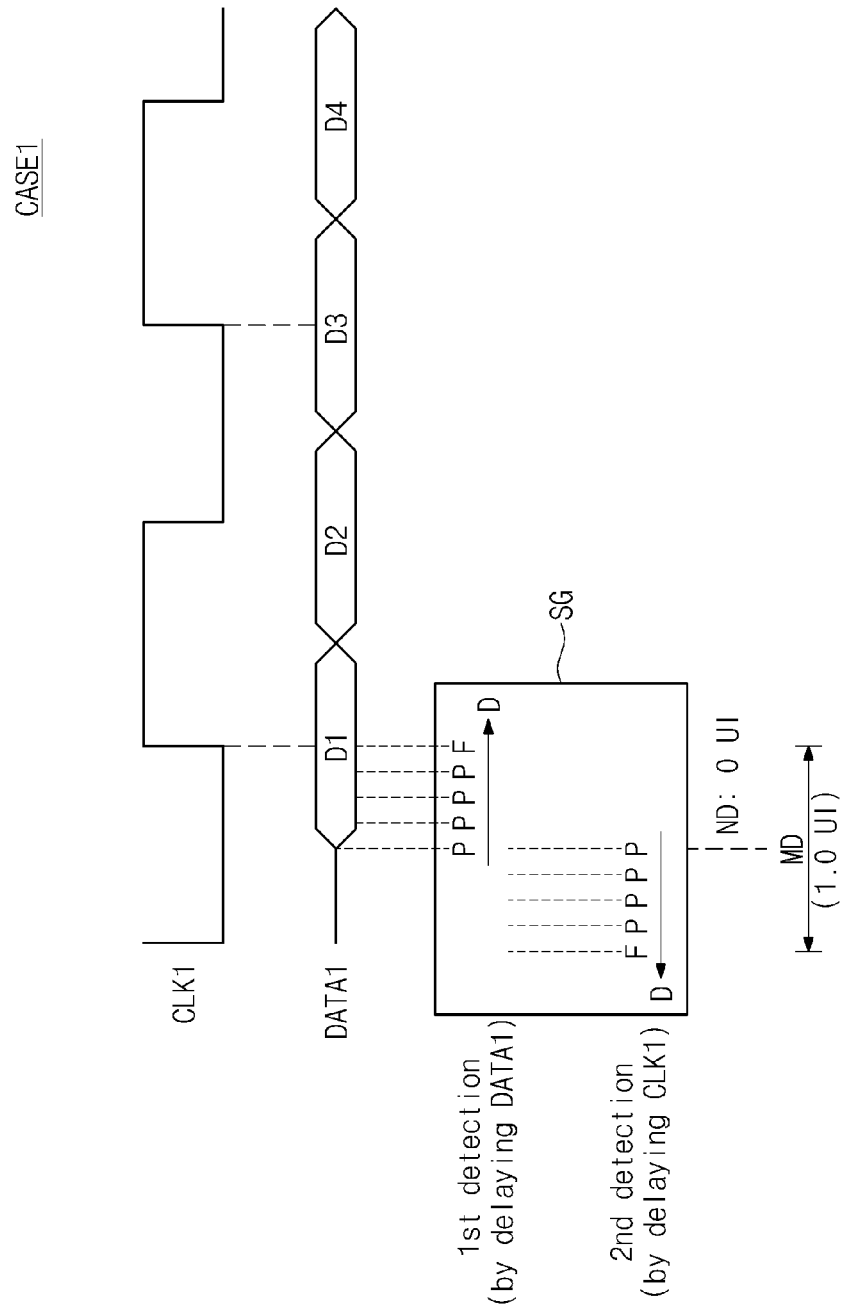

FIGS. 10 through 12 illustrate a first case in which a skew calibration circuit in accordance with some example embodiments of the inventive concepts aligns first data and a first clock signal.

Referring to FIGS. 8 to 12, in the first scenario CASE 1 as described with reference to FIG. 3, the first data DATA1 may be received in a state aligned with the first clock signal CLK1.

An example that the skew calibration circuit 100 performs the first detection while delaying the first data DATA1 is illustrated in FIG. 10.

Referring to FIGS. 8, 9 and 10, the skew calibration circuit 100 gradually delays the first data DATA1 using the first delay unit 110 and the first selection unit 120.

The skew calibration circuit 100 can delay the first data DATA1 until sync of the second data DATA2 and the second clock signal CLK2 is converted from pass P into fail F in a state in which the first clock signal CLK1 selects a first clock output C1 not delayed as the second clock signal CLK2. The skew calibration circuit 100 can perform the first detection until the first data DATA1 is delayed by a maximum of 1.0 UI.

The first output signal O1 may be a signal having the same timing as the first data DATA1. Sync may be passed in the first output signal O1. Syncs may be passed in the second through fourth output signals O2~O4. Sync may be failed in the fifth output signal O5 in which the first data DATA1 is delayed through four delayers D. That is, between the fourth and fifth output signals O4 and O5, sync is converted from pass P into fail F.

The skew calibration circuit 100 determines whether the second data DATA2 and the second clock CLK2 are aligned. To determine whether the second data DATA1 and the second clock CLK2 are aligned, the skew calibration circuit 100 may detect a pass group in a sync graph SG.

Since there are not failing signals each side of the passing signals, the skew calibration circuit 100 may determine that the pass group is not detected in the sync graph SG of FIG. 10, and the first detection is finished in a state in which second data DATA2 and the second clock CLK2 are aligned. The skew calibration circuit 100 can store the amount of delay of the fourth output signal O4 that belongs to a partial pass group. For example, the skew calibration circuit 100 can store the amount of delay of '+4'.

An example that the skew calibration circuit 100 performs the second detection operation while delaying the first clock signal CLK1 is illustrated in FIG. 11.

Referring to FIGS. 8, 9 and 11, the skew calibration circuit 100 gradually delays the first clock signal CLK1 using the second delay unit 140 and the second selection unit 150.

It may be understood that an amount that the first clock signal CLK1 is delayed is identical to an amount that the first data DATA1 is advanced. In FIG. 11, there is illustrated that the first data DATA1 is advanced.

The skew calibration circuit 100 can delay the first clock signal CLK1 until sync of the second data DATA2 and the second clock signal CLK2 is converted from pass P into fail F in a state in which the first data DATA1 selects a first output signal O1 not delayed as the second data DATA2. The skew calibration circuit 100 can perform the second detection until the first clock signal CLK1 is delayed by a maximum of 1.0 UI.

The first output clock C1 may be a signal having the same timing as the first clock signal CLK1. Sync of the first output clock C1 may be passed. Syncs of the second through fourth output clocks C2~C4 may pass. Sync of the fifth output clock C5 in which the first clock signal CLK1 is delayed through four delayers D may fail. That is, between the fourth and fifth clocks C4 and C5, sync is converted from pass P into fail F.

The skew calibration circuit 100 determines whether the second data DATA2 and the second clock CLK2 are aligned by detecting a pass group in a sync graph SG.

Since there are not failing signals on each side of the passing signals, the skew calibration circuit 100 may determine that the pass group is not detected in the sync graph SG of FIG. 11. The skew calibration circuit 100 can store the amount of delay of the fourth output clock C4 that belongs to a partial pass group. For example, it may be understood that the first clock signal CLK1 is delayed a negative amount that the first data DATA1 is delayed. Thus, from a viewpoint of the first data DATA1, the skew calibration circuit 100 can store the amount of delay of '−4'.

An example in which the skew calibration circuit 100 combines a first detection result with a second detection result to align the second data DATA2 and the second clock signal CLK2 is illustrated in FIG. 12.

Referring to FIGS. 10 to 12, if the first detection result of FIG. 10 and the second detection result of FIG. 11 are combined with each other, as illustrated in FIG. 12, the skew calibration circuit 100 can detect a pass group in the sync graph SG.

The skew calibration circuit 100 operates the amount of delay detected in one half of the pass group in the first detection operation and the amount of delay detected in the second half of the pass group detected in the second detection operation to determine the amount of delay that the second data DATA2 and the second clock signal CLK2 are aligned. For example, the skew calibration circuit 100 can add '+4' which is the amount of delay of the first detection to '−4' which is the amount of delay of the second detection. The skew calibration circuit 100 can confirm the amount of delay of '0' as the final amount of delay. Since the final amount of delay is '0', the skew calibration circuit 100 activates none of the delayers D of the first delay unit 110 and the delayers D of the second delay unit 140.

To detect the amount of delay that the second data DATA2 and the second clock signal CLK2 are aligned, the skew calibration circuit 100 activates five delayers among the delayers D of the first delay unit 110 and five delayers among the delayer D of the second delay unit 140.

Therefore, the maximum amount of delay MD corresponds to 1.0 UI and the final amount of delay when the second data DATA2 and the second clock signal CLK2 are aligned is '0'. In contrast, in FIG. 3 the maximum amount of delay MD is 2.5 UI and the final amount of delay is 2.0 UI.

Figure 13:
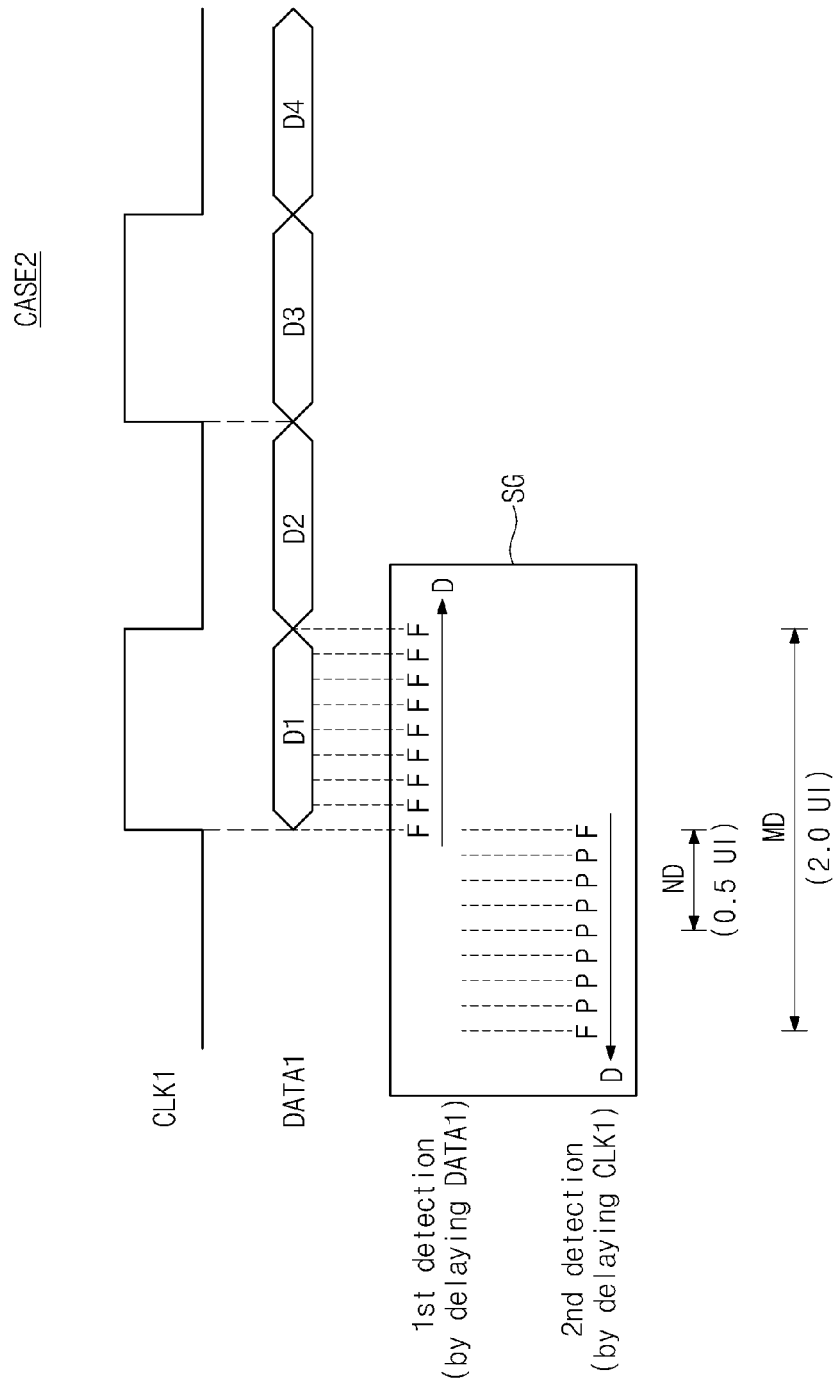
FIG. 13 illustrates a second case in which a skew calibration circuit in accordance with some example embodiments of the inventive concepts aligns first data with a first clock signal.

FIG. 13 illustrates a second case in which a skew calibration circuit in accordance with some example embodiments of the inventive concepts aligns first data and a first clock signal.

Referring to FIGS. 4, 8, 9 and 13, in the second scenario CASE 2, as described with reference to FIG. 4, the first data DATA1 may be delayed by 0.5 UI as compared with the first clock signal CLK1.

The skew calibration circuit 100 can perform the first detection operation while delaying the first data DATA1. Sync of the second data DATA2 and the second clock signal CLK2 may be failed until the first data DATA1 is delayed by 1.0 UI. That is, a pass group or a partial pass group is not detected may not be detected during the first detection operation.

The skew calibration circuit 100 can perform the section detection operation while delaying the first clock signal CLK1. Syncs are passed in the second through eighth output clocks C2~C8 and sync is failed in the ninth output clock C9. That is, sync is converted from a pass P into a fail F between the eighth and ninth output clocks C8 and C9.

Therefore, the skew calibration circuit 100 may detect a pass group while the second detection operation is performed. The skew calibration circuit 100 can confirm a median value (or average value) among the amount of delay of the pass group as the final amount of delay. For example, the skew calibration circuit 100 can confirm the amount of delay of '−4' as the final amount of delay.

According to the final amount of delay, the skew calibration circuit 100 can align the second data DATA2 and the second clock signal CLK2. For example, the skew calibration circuit 100 can control the second code CODE2 so that the fifth output clock C5 which is an output of the fourth delayer among the delayers D of the second delay unit 140 is maintained as the second clock signal CLK2.

Referring to the sync graph SG, the maximum amount of delay MD of the skew calibration circuit 100 corresponds to 2.0 UI and the normal amount of delay ND of the skew calibration circuit 100 corresponds to 0.5 UI. In contrast, as illustrated in FIG. 4, the maximum amount of delay may be 2.0 UI and the normal amount of delay ND may be 1.5 UI.

Figure 14:
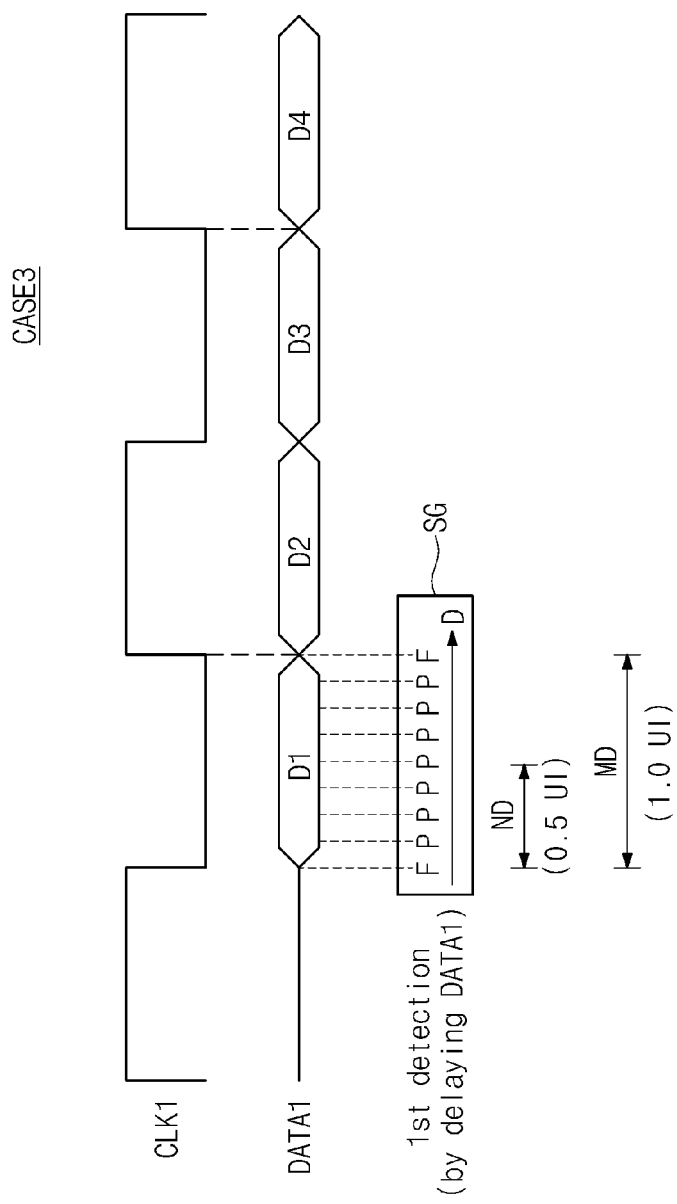
FIG. 14 illustrates a third case in which a skew calibration circuit in accordance with some example embodiments of the inventive concepts aligns first data with a first clock signal.

FIG. 14 illustrates a third case in which a skew calibration circuit in accordance with some embodiments of the inventive concept aligns first data and a first clock signal.

Referring to FIGS. 5, 8, 9 and 14, as described with reference to FIG. 5, in the third scenario CASE 3, the first clock signal CLK1 may be delayed by 0.5 UI as compared with the first data DATA1.

The skew calibration circuit 100 can perform the first detection while delaying the first data DATA1. Sync is failed in the first output signal O1. Syncs are passed in the second through eighth output signals O2~O8. Sync is failed in the ninth output signal O9. Sync is converted from a pass P into a fail F in the eighth and ninth output signals O8 and O9.

Therefore, the skew calibration circuit 100 may detect a pass group while the first detection operation is performed. The skew calibration circuit 100 can confirm a median value (or average value) among the amount of delay of the pass group as the final amount of delay. For example, the skew calibration circuit 100 can confirm the amount of delay of '4' as the final amount of delay. According to the final amount of delay, the skew calibration circuit 100 can align the second data DATA2 and the second clock signal CLK2. For example, the skew calibration circuit 100 can control the first code CODE1 so that the fifth output clock C5 which is an output of the fourth delayer among the delayers D of the first delay unit 110 is maintained as the second data DATA2.

Since the second data DATA2 and the second clock signal CLK2 is aligned in the first detection, the skew calibration circuit 100 can omit the second detection operation.

Referring to the sync graph SG, the maximum amount of delay MD of the skew calibration circuit 100 corresponds to 1.0 UI and the normal amount of delay ND of the skew calibration circuit 100 corresponds to 0.5 UI. As illustrated in FIG. 5, the maximum amount of delay MD and the normal amount of delay ND may also be 1.0 UI and 0.5 UI, respectively.

Figure 15:
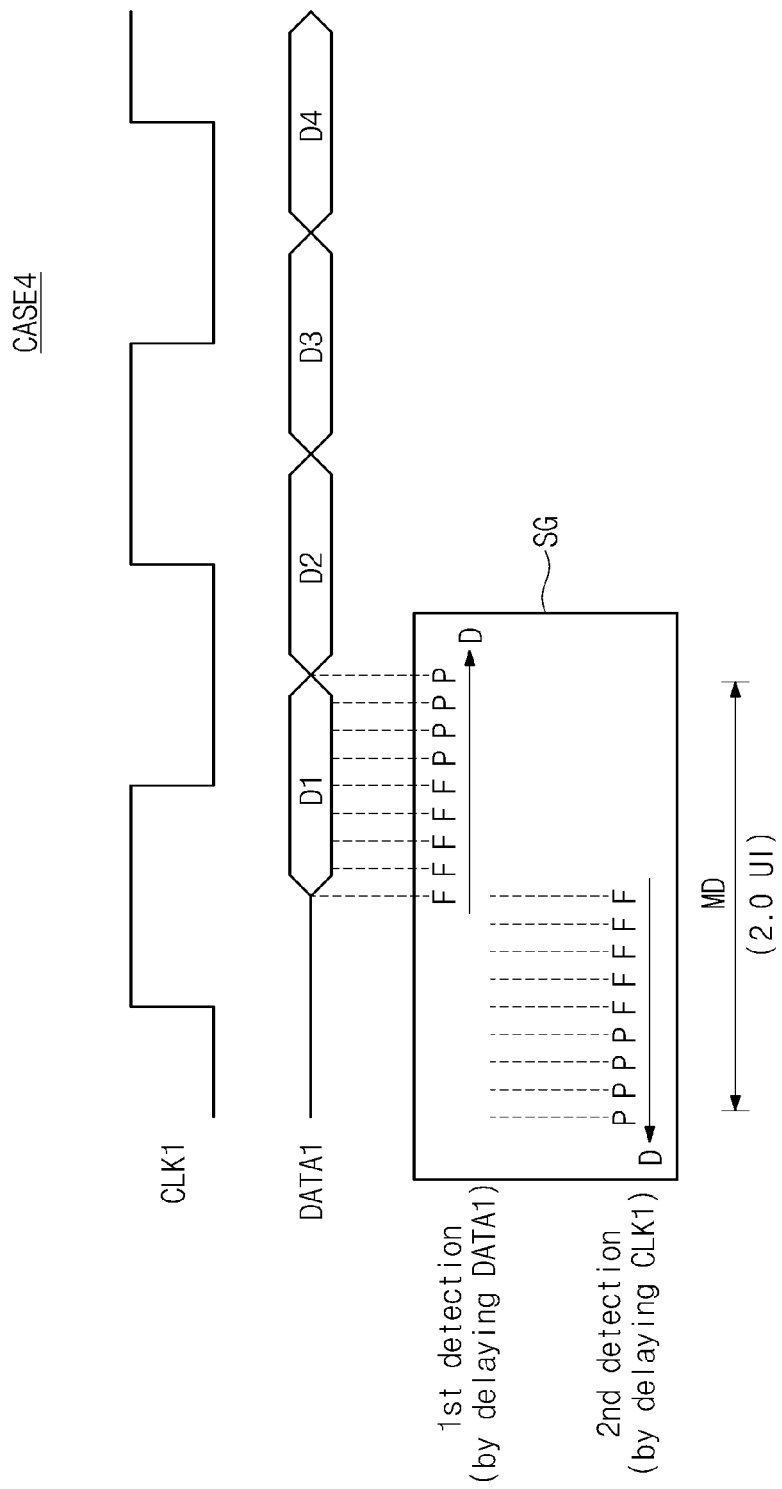
FIGS. 15 and 16 illustrate a fourth case in which a skew calibration circuit in accordance with some example embodiments of the inventive concepts aligns first data with a first clock signal.
Figure 16:
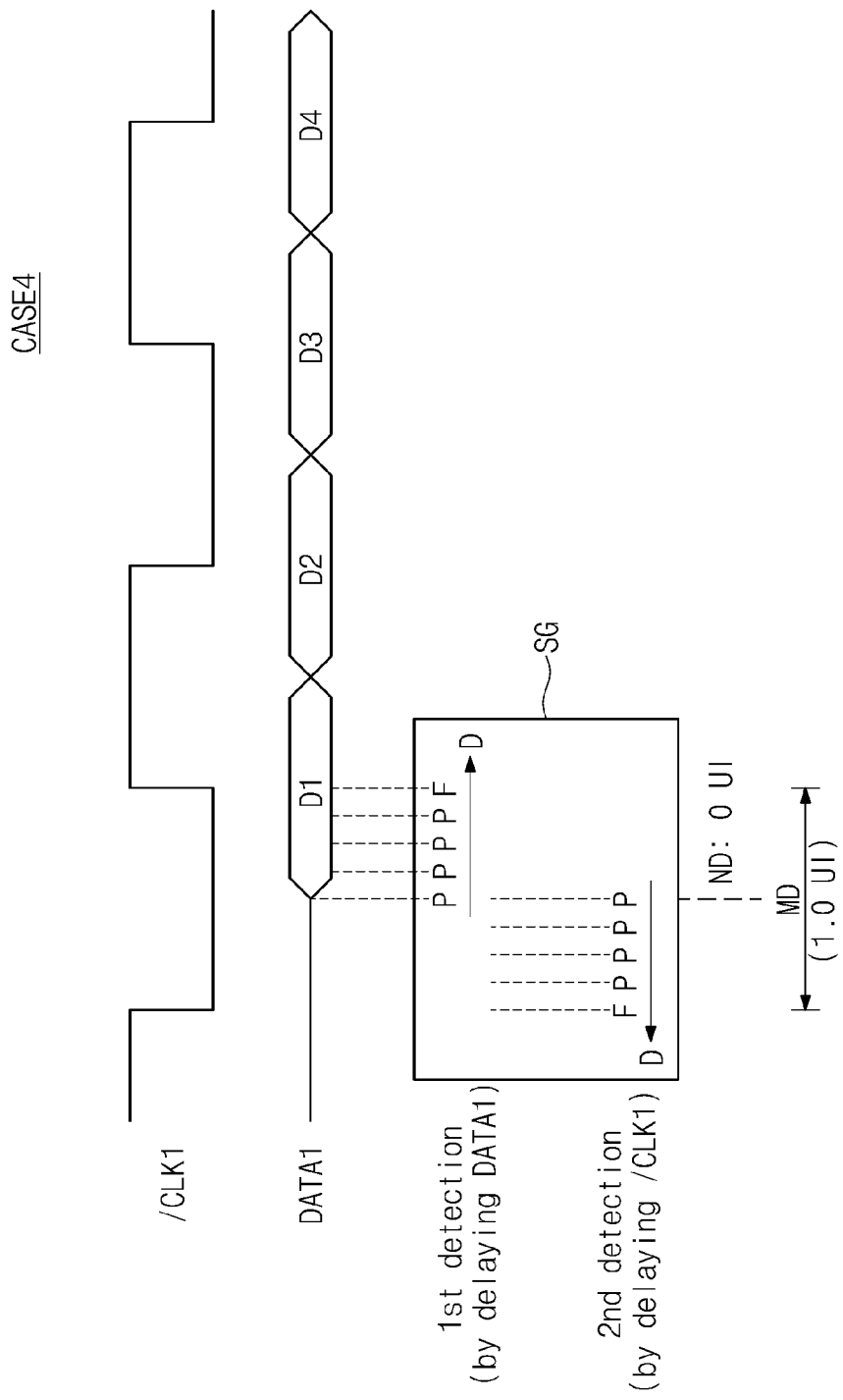

FIGS. 15 and 16 illustrate a fourth case in which a skew calibration circuit in accordance with some example embodiments of the inventive concepts aligns first data and a first clock signal.

Referring to FIGS. 6, 8, 9 and 15, as described with reference to FIG. 6, the first data DATA1 may be delayed by 1.0 UI as compared with the first clock signal CLK1.

The skew calibration circuit 100 can perform the first detection operation while delaying the first data DATA1. In the first detection operation, sync is not converted from a pass P into a fail F until the first data DATA1 is delayed by 1.0 UI.

The skew calibration circuit 100 can perform the second detection operation while delaying the first clock signal CLK1. In the second detection, sync is not converted from a pass P into a fail F until the first clock signal CLK1 is delayed by 1.0 UI.

Even when the first detection and the second detection are performed, the skew calibration circuit 100 may not detect a pass group. That is, the second data DATA2 and the second clock signal CLK2 are not aligned.

In this case, as described in the step S160 of FIG. 9, the skew calibration circuit 100 can perform the first detection operation and the second detection operation again using an inverted clock signal /CLK1 into which the first clock signal CLK1 is inverted.

An example of performing the first detection and the second detection using the inverted clock signal /CLK1 is illustrated in FIG. 16.

Referring to FIGS. 8, 9 and 16, the skew calibration circuit 100 can perform the first detection operation while delaying the first data DATA1. Syncs are passed in the first through fourth output signals O1~O4. Sync is failed in the fifth output signal O5. That is, sync is converted from a pass P into a fail F between the fourth and fifth output signals O4 and O5. The skew calibration circuit 100 can store the amount of delay corresponding to one aspect of the pass group. For example, the skew calibration circuit 100 can store the amount of delay of '+4'.

The skew calibration circuit 100 can perform the second detection operation while delaying the inverted clock signal /CLK1. Syncs are passed in the first through fourth output clocks C1~C4. Sync is failed in the fifth output clock C5. That is, sync is converted from a pass P into a fail F between the fourth and fifth output clocks C4 and C5. The skew calibration circuit 100 can store the amount of delay corresponding to the other aspect of the pass group. For example, the skew calibration circuit 100 can store the amount of delay of '−4'.

The skew calibration circuit 100 can operate the amount of delay detected in the first detection operation and the amount of delay detected in the second detection operation to confirm the final amount of delay. For example, the skew calibration circuit 100 can confirm '0' obtained by adding the amount of delay of '−4' and the amount of delay of '+4' as the final amount of delay. That is, the skew calibration circuit 100 activates none of the delayers D of the first delay unit 110 and the delayers D of the second delay unit 140. The skew calibration circuit 100 can output the inverted clock signal /CLK1 into which the first clock signal CLK1 is inverted as the second clock signal CLK2.

Referring to the sync graph SG of FIGS. 15 and 16, the maximum amount of delay of the skew calibration circuit 100 corresponds to 2.0 UI and the normal amount of delay of the skew calibration circuit 100 corresponds to 0.5 UI. In contrast, as illustrated in FIG. 6, the maximum amount of delay is 1.5 UI and the normal amount of delay is 1.0 UI.

In the case that sync of the second data DATA2 and the second clock signal CLK2 is converted from a fail F into a pass P in the first detection operation and the pass group or a partial pass group is not detected, the skew calibration circuit 100 may omit the second detection operation. The skew calibration circuit 100 can perform the first detection operation and the second detection operation using the inverted clock signal /CLK1 into which the first clock signal CLK1 is inverted. In this case, the maximum amount of delay of the skew calibration circuit 100 may be reduced to 1.0 UI.

Figure 17:
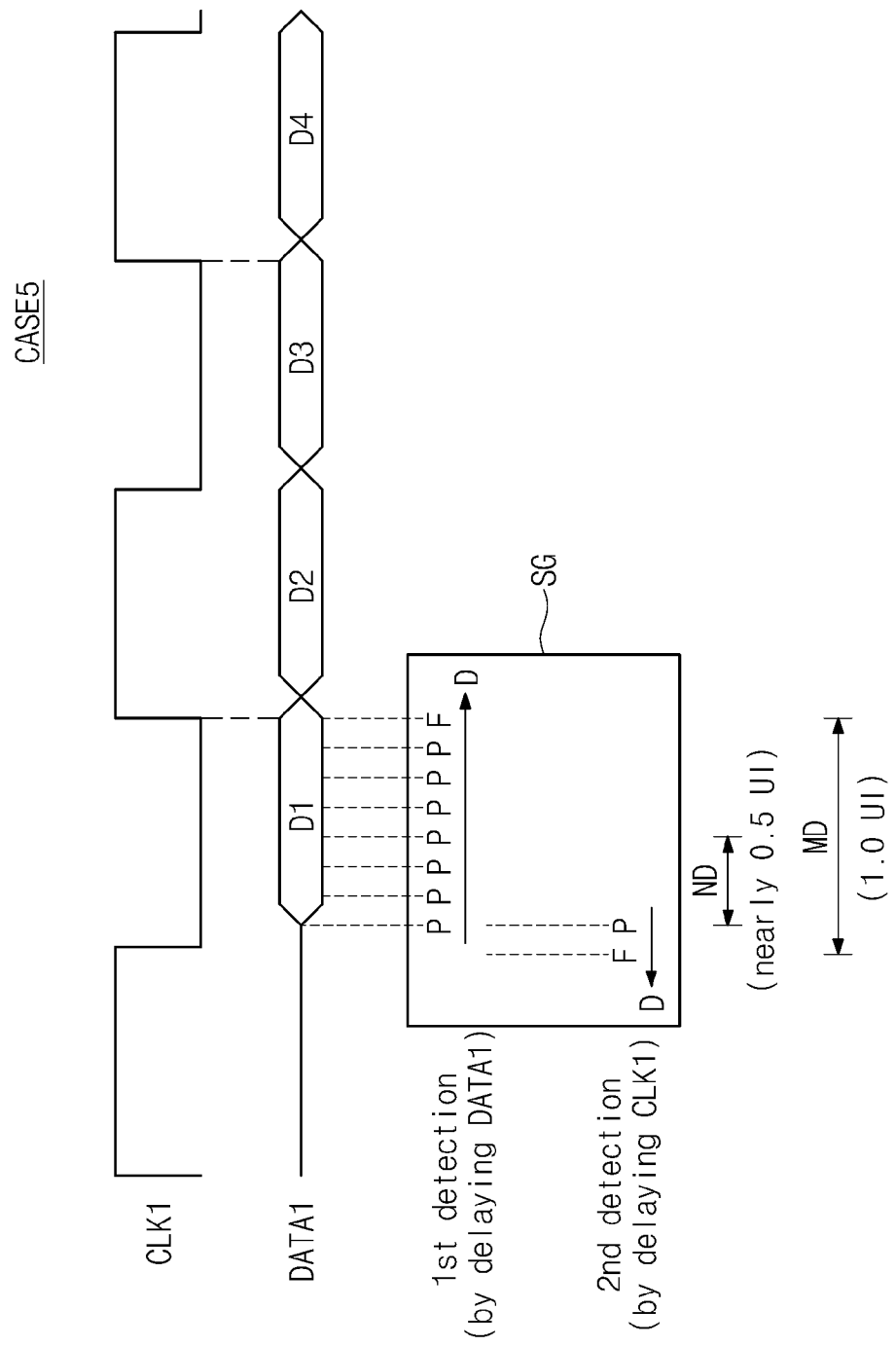
FIG. 17 illustrates a fifth case in which a skew calibration circuit in accordance with some example embodiments of the inventive concepts aligns first data with a first clock signal.

FIG. 17 illustrates a fifth case in which a skew calibration circuit in accordance with some embodiments of the inventive concept aligns first data and a first clock signal.

Referring to FIGS. 7, 8, 9 and 17, as described with reference to FIG. 7, the first clock signal CLK1 may be delayed by 0.5 UI as compared with the first data DATA1.

The skew calibration circuit 100 can perform the first detection operation while delaying the first data DATA1. Sync is failed in the eighth output signal O8. Syncs are passed in the first through seventh output signals O1~O7. Sync is failed in the ninth output signal O9. Sync is converted from a pass P into a fail F in the eighth and ninth output signals O8 and O9. In the seventh and eighth output signals O7 and O8, sync is converted from pass P into fail F. The skew calibration circuit 100 can store the amount of delay corresponding to one aspect of the pass group. For example, the skew calibration circuit 100 can store the amount of delay of '+6'.

The skew calibration circuit 100 can perform the second detection while delaying the first clock signal CLK1. Sync is passed in the first output clock C1. Sync is failed in the second output clock C2. Sync is converted from a pass P into a fail F in the first and second output clocks C1 and C2. In the seventh and eighth output signals O7 and O8, sync is converted from pass P into fail F. The skew calibration circuit 100 can store the amount of delay corresponding to the other aspect of the pass group. For example, the skew calibration circuit 100 can store the amount of delay of '0'.

The skew calibration circuit 100 can operate the amount of delay detected in the first detection and the amount of delay detected in the second detection to confirm the final amount of delay. For example, the skew calibration circuit 100 can confirm '3' obtained by adding the amount of delay of '+6' and the amount of delay of '0' as the final amount of delay. That is, the skew calibration circuit 100 can activate three delayers among the delayers D of the first delay unit 110. The skew calibration circuit 100 can control the first code CODE1 so that the fourth output signal O4 corresponding to an output of the third delayer of the first delay unit 110 is maintained as the second data DATA2.

The maximum amount of delay and the normal amount of delay of the first through fifth cases of the skew calibration circuit 10 and the maximum amount of delay and the normal amount of delay of the first through fifth cases of the skew calibration circuit 100 are aligned in a table 1 below.

TABLE 1

|  | Skew calibration circuit (10) | Skew calibration circuit (100) |
|---|---|---|
| First case | MD: 2.5 UI<br>ND: 2.0 UI | MD: 1.0 UI<br>ND: 0 UI |
| Second case | MD: 2.0 UI<br>ND: 1.5 UI | MD: 2.0 UI<br>ND: 0.5 UI |
| Third case | MD: 1.0 UI<br>ND: 0.5 UI | MD: 1.0 UI<br>ND: 0.5 UI |
| Fourth case | MD: 1.5 UI<br>ND: 1.0 UI | MD: 2.0 UI<br>ND: 0 UI |
| Fifth case | MD: 3.0 UI<br>ND: 2.5 UI | MD: 1.0 UI<br>ND: 0.5 UI |
| The maximum value of MD | 3.0 UI | 2.0 UI |
| Average of ND | 1.5 UI | 0.25 UI |

Referring to the table 1, in the skew calibration circuit 10 the maximum value of the maximum amount of delay MD is 3.0 UI. That is, the delay unit 11 of the skew calibration circuit 10 may be designed to include delayers D corresponding to 3.0 UI. In contrast, in the skew calibration circuit 100 the maximum value of the maximum amount of delay MD is 2.0 UI. Therefore, the amount of delay of the delayers D of the first delay unit 110 of the skew calibration circuit 100 is 1.0 UI and the amount of delay of the delayers D of the second delay unit 140 is 1.0 UI. Thus, the skew calibration circuit 100 may occupy a smaller size compared with the skew calibration circuit 10 and may be embodied at lower cost.

While an average of the normal amount of delay ND of the skew calibration circuit 10 is 1.5 UI, an average of the normal amount of delay ND of the skew calibration circuit 100 is 0.5 UI. To maintain an alignment of the second data DATA2 and the second clock signal CLK2, the skew calibration circuit 100 activates delayers corresponding to 0.25 UI on average, while the skew calibration circuit 10 activates delayers corresponding to 1.5 UI on average. Thus, the skew calibration circuit 100 consumes power lower than the skew calibration circuit 10.

While the maximum value of the maximum amount of delay MD of the skew calibration circuit 10 is 3.0 UI, an average of the maximum amount of delay MD of the skew calibration circuit 100 is 2.0 UI. Thus, the skew calibration circuit 100 has a calibration speed higher than the skew calibration circuit 10 and consumes lower power than the skew calibration circuit 10. As described in FIGS. 15 and 16, in the case that in the fourth case, the skew calibration circuit 100 is configured to perform the first and second detections using the inverted clock signal /CLK1 without performing the second detection using the first clock signal CLK1, a calibration speed of the skew calibration circuit 100 can be improved more and its power consumption can be more reduced.

In the example embodiment described above, the skew calibration circuit 100 performs a detection of delay of the first clock signal CLK1 after performing a detection of delay of the first data DATA1. However, the skew calibration circuit 100 may be modified or applied so that a detection of delay of the first clock signal CLK1 is performed first and then a detection of delay of the first data DATA1 is performed.

Figure 18:
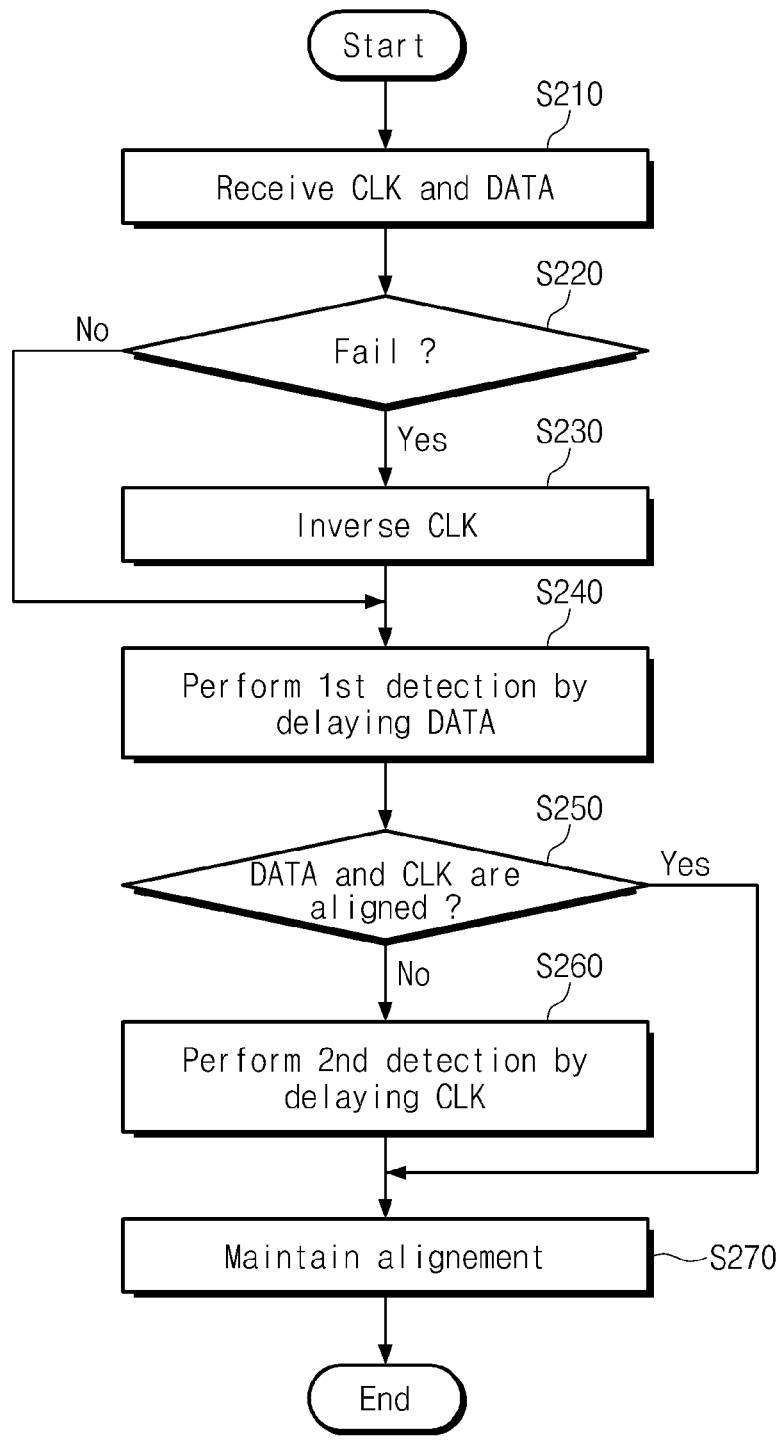
FIG. 18 is a flowchart illustrating a second example of an operation method of a skew calibration circuit in accordance with some example embodiments of the inventive concepts.

FIG. 18 is a flowchart illustrating a second example embodiment of an operation method of a skew calibration circuit in accordance with some example embodiments of the inventive concepts.

Referring to FIGS. 8 and 18, in operation S210, the skew calibration circuit 100 receives the first data DATA1 and the first clock signal CLK1.

In operation S220, the skew calibration circuit 100 determines whether sync of the first data DATA1 and the first clock signal CLK1 are failed. If the sync is not failed, the skew calibration circuit performs operation S240. If the sync is failed, the skew calibration circuit 100 may invert the first clock signal CLK1 in a step S230. That is, the first clock signal CLK1 may be inverted and provided to the second delay unit 140.

In operation S240, the skew calibration circuit 100 performs the first detection operation.

In operation S250, the skew calibration circuit 100 may determine if the second data DATA2 and the second clock signal CLK2 are aligned. If the skew calibration circuit 100 determines that the second data DATA2 and the second clock signal CLK2 are aligned, then in operation S270 the skew calibration circuit 100 maintains an alignment. In contrast, if the skew calibration circuit 100 determines that the second data DATA2 and the second clock signal CLK2 are not aligned, in operation S260, the skew calibration circuit 100 performs the second detection operation. If the second detection is performed, the second data DATA2 and the second clock signal CLK2 are aligned, and, thereafter, in operation S270, the skew calibration circuit 100 maintains an alignment.

As described above, if the first data DATA1 and the first clock signal CLK1 are passed, the skew calibration circuit 100 performs an alignment using the first data DATA1 and the first clock signal CLK1. If sync of the first data DATA1 and the first clock signal CLK1 is failed, the skew calibration circuit 100 performs an alignment using the first data DATA1 and the inverted clock signal /CLK1.

As described with reference to FIG. 12, in the first case, sync of the first data DATA1 and the first clock signal CLK1 is passed. Thus, although an alignment is performed according to the method illustrated in FIG. 18, the skew calibration circuit 100 can align the first data DATA1 and the first clock signal CLK1 using the same method as that described with reference to FIG. 12.

As described with reference to FIG. 13, in the second case, sync of the first data DATA1 and the first clock signal CLK1 is failed. In the case that an alignment is performed according to the method illustrated in FIG. 18, the skew calibration circuit 100 can perform an alignment using the first data DATA1 and the inverted clock signal /CLK1. An example of performing an alignment using the first data DATA1 and the inverted clock signal /CLK1 is illustrated in FIG. 19.

Figure 19:
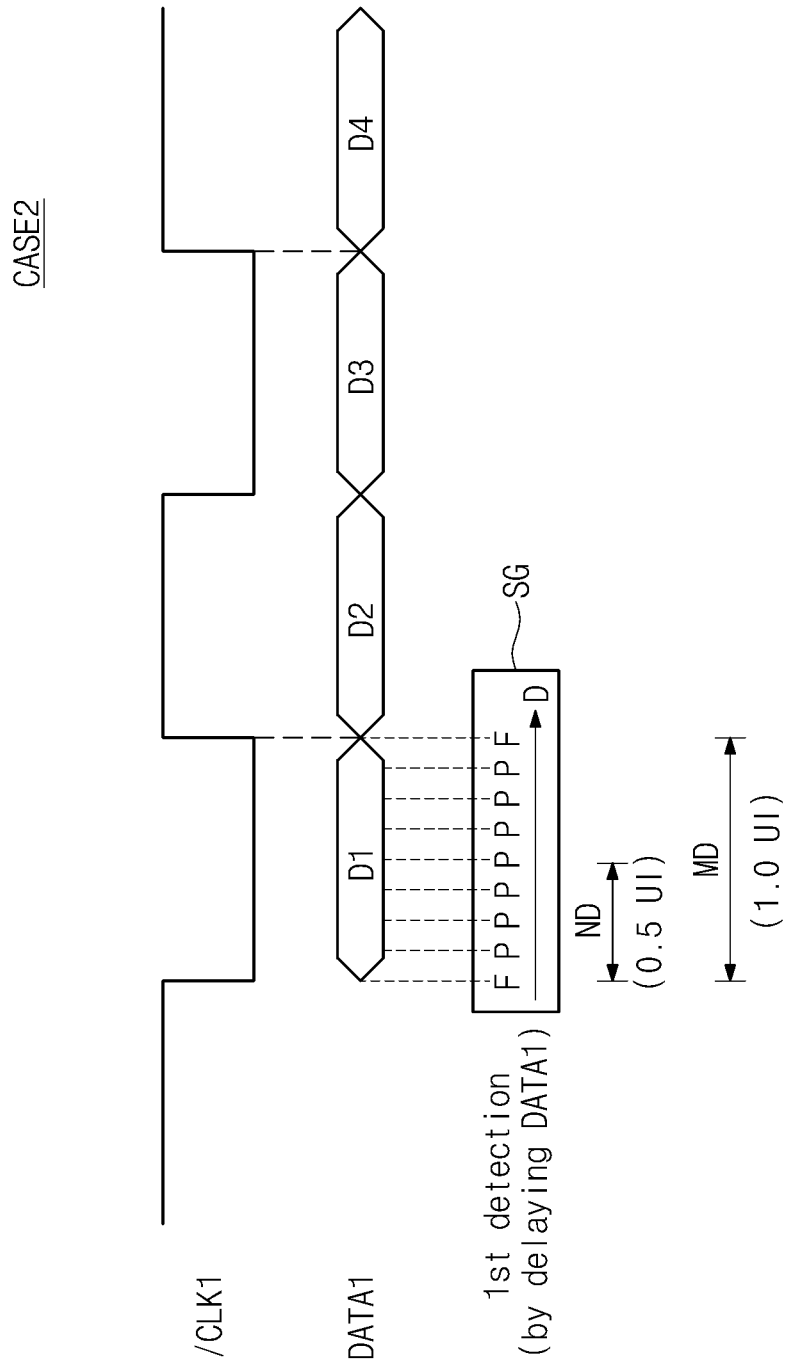
FIG. 19 illustrates a second case in which a skew calibration circuit in accordance with some example embodiments of the inventive concepts aligns first data with an inverted clock signal.

Referring to FIGS. 8, 18 and 19, the skew calibration circuit 100 can perform the first detection while delaying the first data DATA1. In the first output signal O1, sync is failed. Syncs are passed in the second through eighth output signals O2~O8. Sync is failed in the ninth output signal O9. That is, sync is converted from a pass P into a fail F in the eighth and ninth output signals O8 and O9.

A pass group is detected while the first detection is performed. The skew calibration circuit 100 can omit the second detection. The skew calibration circuit 100 can confirm a median value (or average value) among the amount of delay of the pass group as the final amount of delay. For example, the skew calibration circuit 100 can confirm the amount of delay of '+4' as the final amount of delay. According to the final amount of delay, the skew calibration circuit 100 can align the second data DATA2 and the second clock signal CLK2. For example, the skew calibration circuit 100 can control the first code CODE1 so that the fifth output signal O5 which is an output of the fourth delayer among the delayers D of the first delay unit 110 is maintained as the second data DATA2. The skew calibration circuit 100 can control the selection signal SEL so that the inverted clock signal /CLK1 is provided to the second delay unit 140.

Referring to the sync graph, the maximum amount of delay MD of the skew calibration circuit 100 corresponds to 1.0 UI and the normal amount of delay ND of the skew calibration circuit 100 corresponds to 0.5 UI As described with reference to FIG. 14, in the third case, sync of the first data DATA1 and the first clock signal CLK1 is failed. In the case that an alignment is performed according to the method illustrated in FIG. 18, the skew calibration circuit 100 can perform an alignment using the first data DATA1 and the inverted clock signal /CLK1. An example of performing an alignment using the first data DATA1 and the inverted clock signal /CLK1 is illustrated in FIG. 20.

Figure 20:
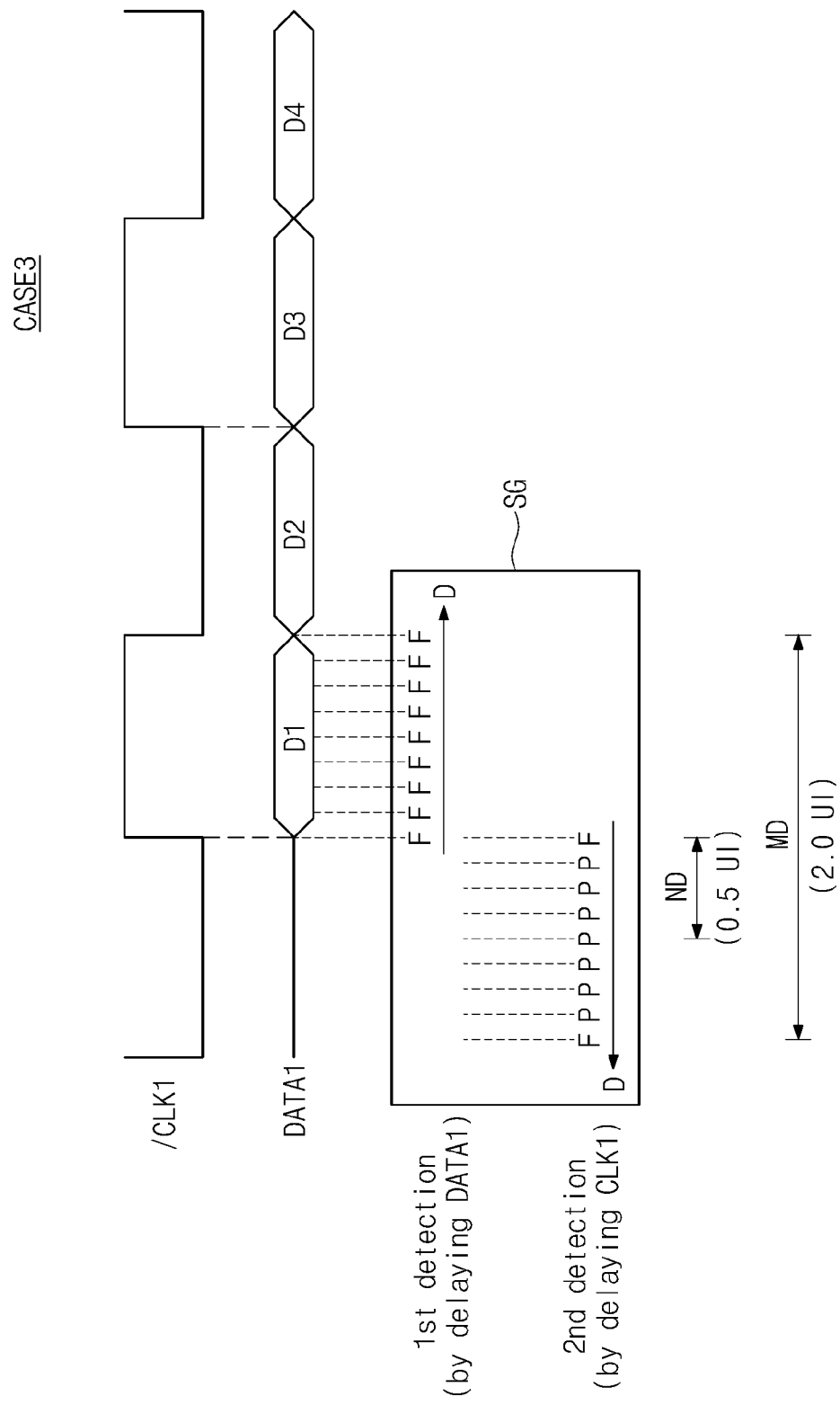
FIG. 20 illustrates a third case in which a skew calibration circuit in accordance with some example embodiments of the inventive concepts aligns first data with an inverted clock signal.

Referring to FIGS. 8, 18 and 20, the skew calibration circuit 100 can perform the first detection while delaying the first data DATA1. Sync of the second data DATA2 and the second clock signal CLK2 may be failed until the first data DATA1 is delayed by a value corresponding to 1.0 UI. That is, a pass group or one aspect of the pass group is not detected during the first detection.

The skew calibration circuit 100 can perform the section detection while delaying the inverted clock signal /CLK1. Syncs are passed in the second through eighth output clocks C2~C8 and sync is failed in the ninth output clock C9. That is, sync is converted from a pass P into a fail F in the eighth and ninth output clocks C8 and C9.

A pass group is detected while the second detection is performed. The skew calibration circuit 100 can confirm a median value (or average value) among the amount of delay of the pass group as the final amount of delay. For example, the skew calibration circuit 100 can confirm the amount of delay of '−4' as the final amount of delay. According to the final amount of delay, the skew calibration circuit 100 can align the second data DATA2 and the second clock signal CLK2. For example, the skew calibration circuit 100 can control the second code CODE2 so that the fifth output clock C5 which is an output of the fourth delayer among the delayers D of the second delay unit 140 is maintained as the second clock signal CLK2. The skew calibration circuit 100 can control the selection signal SEL so that the inverted clock signal /CLK1 is provided to the second delay unit 140.

Referring to the sync graph SG, the maximum amount of delay MD of the skew calibration circuit 100 corresponds to 2.0 UI and the normal amount of delay ND of the skew calibration circuit 100 corresponds to 0.5 UI.

As described with reference to FIGS. 15 and 16, in the fourth case, sync of the first data DATA1 and the first clock signal CLK1 is failed. The skew calibration circuit 100 can perform the detection described in FIG. 16 using the inverted clock signal /CLK1 without performing the detection illustrated in FIG. 15.

As described with reference to FIG. 17, in the fifth case, sync of the first data DATA1 and the first clock signal CLK1 is passed. Thus, although an alignment is performed according to the method illustrated in FIG. 18, the skew calibration circuit 100 can align the first data DATA1 and the first clock signal CLK1 using the same method as that described with reference to FIG. 17.

Figure 21:
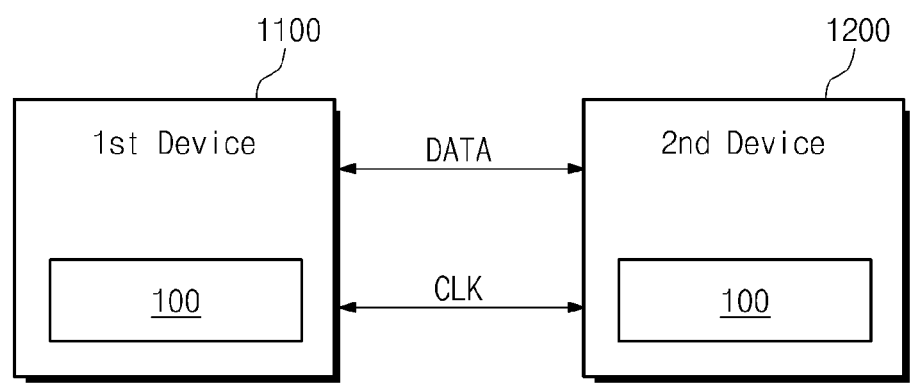
FIG. 21 is a block diagram illustrating semiconductor devices in accordance with some example embodiments of the inventive concepts.

FIG. 21 is a block diagram illustrating semiconductor devices in accordance with some example embodiments of the inventive concepts.

Referring to FIG. 21, a first semiconductor device 1100 and a second semiconductor device 1200 can exchange data DATA and a clock signal CLK. The first semiconductor device 1100 includes a skew calibration circuit 100 that aligns data DATA and a clock signal CLK being received from the second semiconductor device 1200. The second semiconductor device 1200 includes a skew calibration circuit 100 that aligns data DATA and a clock signal CLK being received from the first semiconductor device 1100. Each of the skew calibration circuits 100 of the first semiconductor device 1100 and the second semiconductor device 1200 may include the skew calibration circuit 100 described with reference to FIG. 8.

Each of the semiconductor devices 1100 and 1200 may include various devices configured to receive data DATA and a clock signal CLK. Each of the semiconductor devices 1100 and 1200 may include a semiconductor chip, a semiconductor circuit, a semiconductor memory, a memory card, a solid state drive, a smart phone, a smart pad, a smart camera, or a computer that receives data DATA and a clock signal CLK.

According to the example embodiments of the inventive concepts, data and a clock signal are delayed and the amount of delay is limited to a period in which one bit of data is transmitted. Since the amount of delay of the data and the clock signal is reduced, a skew calibration circuit having a reduced size, reduced power consumption and a high calibration speed, and an operation method of the skew calibration circuit are provided.

Although a few example embodiments of the present general inventive concepts have been shown and described, it will be appreciated by those skilled in the art that changes may be made in these example embodiments without departing from the principles and spirit of the example embodiments of the inventive concepts, the scope of which is defined in the appended claims and their equivalents. Therefore, the above-disclosed subject matter is to be considered illustrative, and not restrictive.

What is claimed is:
1. A skew calibration circuit comprising:
a data delay unit configured to receive first data and a first code, and to output second data by delaying the first data based on the first code;
a clock delay unit configured to receive a first clock signal and a second code, and to output a second clock signal by delaying the first clock signal based on the second code;
a multiplexer configured to output, as the first clock signal, one of a received clock signal or an inverted version of the received clock signal based on a selection signal; and
a control logic unit configured to receive the second data and the second clock signal, and to generate the first code, the second code and the selection signal based on the second data and the second clock signal.

2. The skew calibration circuit of claim 1, wherein the data delay unit is configured to control an amount of delay between the first data and the second data based on the first code.

3. The skew calibration circuit of claim 2, wherein a maximum amount of delay between the first data and the second data corresponds to a period of time in which one bit of the first or second data is transmitted from an external device to the skew calibration circuit.

4. The skew calibration circuit of claim 1, wherein the data delay unit is configured to control an amount of delay between the first clock signal and the second clock signal based on the second code.

5. The skew calibration circuit of claim 4, wherein a maximum amount of delay between the first clock signal and the second clock signal corresponds to a period of time in which one bit of the first or second data is transmitted from an external device to the skew calibration circuit.

6. The skew calibration circuit of claim 1, wherein
the second data includes a pattern of bits, and
the control unit is configured to control the first code and the second code such that a first bit of the second data is aligned with a rising or falling edge of the received clock signal.

7. The skew calibration circuit of claim 6, wherein the control unit is configured to control an amount of delay between the first data and the second data by generating the first code and determining whether the first bit is aligned with the rising or falling edge of the received clock signal.

8. The skew calibration circuit of claim 7, wherein if the first bit is aligned with the rising or falling edge of the received clock signal, the control unit is configured to set the first code such that the delay unit maintains the amount of delay.

9. The skew calibration circuit of claim 7, wherein if the first bit is not aligned with the rising or falling edge, the control unit is configured to control an amount of delay between the first clock signal and the second clock signal by generating the second code and determining whether the first bit is aligned with the rising or falling edge of the received clock signal.

10. The skew calibration circuit of claim 9, wherein the control unit is configured to determine whether the first bit is aligned with the rising or falling edge of the received clock signal by controlling the amount of delay between the first data and the second data and controlling the amount of delay between the first clock signal and the second clock signal.

11. The skew calibration circuit of claim 6, wherein if a value of the first data is not the first bit when the rising edge or the falling edge of the received clock signal occurs, the control unit is configured to set the selection signal such that the multiplexer outputs the inverted version of the received clock signal as the first clock signal.

12. A method of operating a skew calibration circuit to calibrate a skew between data and a clock signal, the method comprising:
receiving the clock signal and the data;
first detecting whether the clock signal is aligned with the data while delaying the data;
second detecting whether the clock signal is aligned with the data while delaying the clock signal, if the first detecting detects that the clock signal is not aligned with the data; and
maintaining an alignment between the clock signal and the data, if the first detecting or the second detecting detects that the clock signal is aligned with the data.

13. The operation method of claim 12, further comprising:
inverting the clock signal and performing the first detecting again using the inverted clock signal, if the second detecting detects that the clock signal is not aligned with the data.

14. The operation method of claim 12, wherein
the first detecting includes detecting a first point at which synchronization between the delayed data and the clock signal fails while sequentially increasing a delay of the data,
the second detecting includes detecting a second point at which synchronization between the delayed data and the clock signal fails while sequentially increasing a delay of the clock signal, and
the method further comprises:
delaying the data to a point between the first point and the second point, if the first point and the second point define a fail group, and
determining whether the median point corresponds to a range in which the clock signal is delayed, the clock signal is delayed to the median point to be aligned.

15. The operation method of claim 14, wherein if synchronization between the data and the clock signal fails, the first detecting comprises:
detecting a third point at which synchronization between the delayed data and the clock signal fails while sequentially increasing the delay of the data;
detecting a fourth point at which synchronization between the delayed data and the clock signal is fails after the first point while sequentially increasing the delay of the data, if the third point is detected;
aligning the data and the clock signal using a median point of the third point and the fourth point, if the fourth point is detected; and
inverting the clock signal and performing the first detecting again, if the fourth point is not detected.

16. A skew calibration circuit comprising:
first buffers configured to delay a received data signal to generate an output data signal;
second buffers configured to generate an output clock signal by delaying one of a received clock signal and an inverted version of the received clock signal based on a selection signal;
a switching device configured to enable a number of the first buffers and a number of the second buffers based on a first code and a second code, respectively; and
a controller configured to generate the first code, the second code, and the selection signal based on the output data signal and the output clock signal.

17. The skew calibration circuit of claim 16, wherein the controller is configured to generate the first code and the second code by,
first determining if a pass group exists in the output data signal by increasing the number of first buffers that are enabled by the switching device until one of a state change in synchronization between the received data signal and the received clock signal occurs twice and a period of time in which one bit of the received data signal is transmitted elapses,
second determining if the pass group exists between the output data signal and the output clock signal, if the first determining determines that the pass group does not exist in the output data signal, the second determining includes increasing the number of second buffers that are enabled by the switching device until one of a state change in synchronization between the received data signal and the received clock signal occurs twice and a period of time in which one bit of the received data signal is transmitted elapses, and
generating the first code and the second code based on a number of buffers enabled at a median point in the pass group, wherein
the pass group is a group of one or more of the output data signal and the output clock signal that are skewed less than half a period of the received clock signal when the first determining and the second determining increase the number of first buffers and the number of second buffers, respectively.

18. The skew calibration circuit of claim 17, wherein the controller is configured to generate the selection signal such that the second buffers receive the inverted version of the received clock signal and perform the first determining again, if the second determining determines that the pass group does not exist between the output data signal and the output clock signal.

19. The skew calibration circuit of claim 16, wherein a maximum amount of delay between the received data signal and the output data signal corresponds to a period of time in which one bit of the received data signal is transmitted from an external device to the skew calibration circuit.

* * * * *